(12) United States Patent
David et al.

(10) Patent No.: US 11,309,478 B2
(45) Date of Patent: Apr. 19, 2022

(54) ENHANCED SUPERCONDUCTING TRANSITION TEMPERATURE IN ELECTROPLATED RHENIUM

(71) Applicant: The Regents of the University of Colorado, a body corporate, Denver, CO (US)

(72) Inventors: Donald David, Broomfield, CO (US); David Pappas, Boulder, CO (US); Xian Wu, Westminster, CO (US)

(73) Assignees: The Regents of the University of Colorado, a body corporate, Denver, CO (US); The Government of the United States of America, as represented by the Secretary of Commerce National Institite of Standards and Technology, Gaithersburg, MD (US)

( * ) Notice: Subject to any disclaimer, the term of this patent is extended or adjusted under 35 U.S.C. 154(b) by 0 days.

(21) Appl. No.: 17/221,346

(22) Filed: Apr. 2, 2021

(65) Prior Publication Data
US 2021/0226113 A1    Jul. 22, 2021

Related U.S. Application Data

(63) Continuation of application No. 16/919,505, filed on Jul. 2, 2020, now Pat. No. 11,018,290, which is a continuation of application No. 16/289,599, filed on Feb. 28, 2019, now Pat. No. 10,741,742.

(Continued)

(51) Int. Cl.
*H01L 39/12* (2006.01)
*H01B 12/02* (2006.01)
(Continued)

(52) U.S. Cl.
CPC ............ *H01L 39/12* (2013.01); *B32B 15/043* (2013.01); *H01B 12/02* (2013.01); *H01L 39/14* (2013.01);
(Continued)

(58) Field of Classification Search
CPC ......... H01L 39/12; H01L 39/14; H01L 39/24; B32B 15/043; B32B 2255/06;
(Continued)

(56) References Cited

U.S. PATENT DOCUMENTS

| 3,109,053 A | 10/1963 | Ahearn |
| 4,965,656 A | 10/1990 | Koubuchi et al. |

(Continued)

FOREIGN PATENT DOCUMENTS

WO    2018106942 A1    6/2018

OTHER PUBLICATIONS

Gruber, Stephen S., "Amendment After Allowance Under 37 CFR 1.312", dated Apr. 24, 2020, p. 6, Published in: US.

(Continued)

*Primary Examiner* — Steven T Sawyer
(74) *Attorney, Agent, or Firm* — Neugeboren O'Dowd PC

(57) ABSTRACT

This disclosure describes systems, methods, and apparatus for multilayer superconducting structures comprising electroplated Rhenium, where the Rhenium operates in a superconducting regime at or above 4.2 K, or above 1.8 K where specific temperatures and times of annealing have occurred. The structure can include at least a first conductive layer applied to a substrate, where the Rhenium layer is electroplated to the first layer. A third layer formed from the same or a different conductor as the first layer can be formed atop the Rhenium layer.

20 Claims, 19 Drawing Sheets

Related U.S. Application Data

(60) Provisional application No. 62/727,825, filed on Sep. 6, 2018, provisional application No. 62/636,611, filed on Feb. 28, 2018.

(51) Int. Cl.
    *H01L 39/24* (2006.01)
    *B32B 15/04* (2006.01)
    *H01L 39/14* (2006.01)
    *H01B 12/06* (2006.01)

(52) U.S. Cl.
    CPC .......... *H01L 39/24* (2013.01); *B32B 2255/06* (2013.01); *B32B 2255/205* (2013.01); *B32B 2307/202* (2013.01); *B32B 2457/08* (2013.01); *H01B 12/06* (2013.01)

(58) Field of Classification Search
    CPC ........ B32B 2255/205; B32B 2307/202; B32B 2457/08; H01B 12/02; H01B 12/06; H05K 3/241; H05K 3/181; H05K 2201/0338; H05K 2201/0391; H05K 2203/0723; H05K 2203/1476
    See application file for complete search history.

(56) References Cited

U.S. PATENT DOCUMENTS

| | | | |
|---|---|---|---|
| 8,222,746 | B2 | 7/2012 | Lavoie et al. |
| 10,157,842 | B1 | 12/2018 | Abraham et al. |
| 10,895,015 | B1 | 1/2021 | Schaedler et al. |
| 2001/0031549 | A1 | 10/2001 | Crawford et al. |
| 2006/0138659 | A1 | 6/2006 | Liu et al. |
| 2008/0296768 | A1 | 12/2008 | Chebiam et al. |
| 2011/0281157 | A1 | 11/2011 | Seymour |
| 2014/0246763 | A1 | 9/2014 | Bunyk |
| 2015/0348681 | A1 | 12/2015 | Huh |
| 2016/0005958 | A1 | 1/2016 | Seino et al. |
| 2017/0077037 | A1 | 3/2017 | Kelly et al. |
| 2017/0159375 | A1 | 6/2017 | Thomas et al. |
| 2018/0013052 | A1* | 1/2018 | Oliver ................. H01L 25/0652 |
| 2018/0102470 | A1 | 4/2018 | Das et al. |
| 2018/0261932 | A1 | 9/2018 | Tuckerman |
| 2019/0259931 | A1 | 8/2019 | Megrant |

OTHER PUBLICATIONS

Sawyer, Steven T., "Office Action Regarding U.S. Appl. No. 16/289,599", dated Oct. 9, 2019, p. 13, Published in: US.

Gruber, Stephen, "Response to Office Action Regarding U.S. Appl. No. 16/289,599", dated Feb. 6, 2020, p. 8, Published in: US.

Sawyer, Steven T., "Office Action Regarding U.S. Appl. No. 16/919,505", dated Oct. 16, 2020, p. 12, Published in: US.

Gruber, Stephen S., "Response to Office Action Regarding U.S. Appl. No. 16/919,505", dated Jan. 13, 2021, p. 11, Published in: US.

Khan, H.R., "Superconducting Gold Alloys", Gold Bull., 1984, pp. 94-100, vol. 17, No. 3.

\* cited by examiner

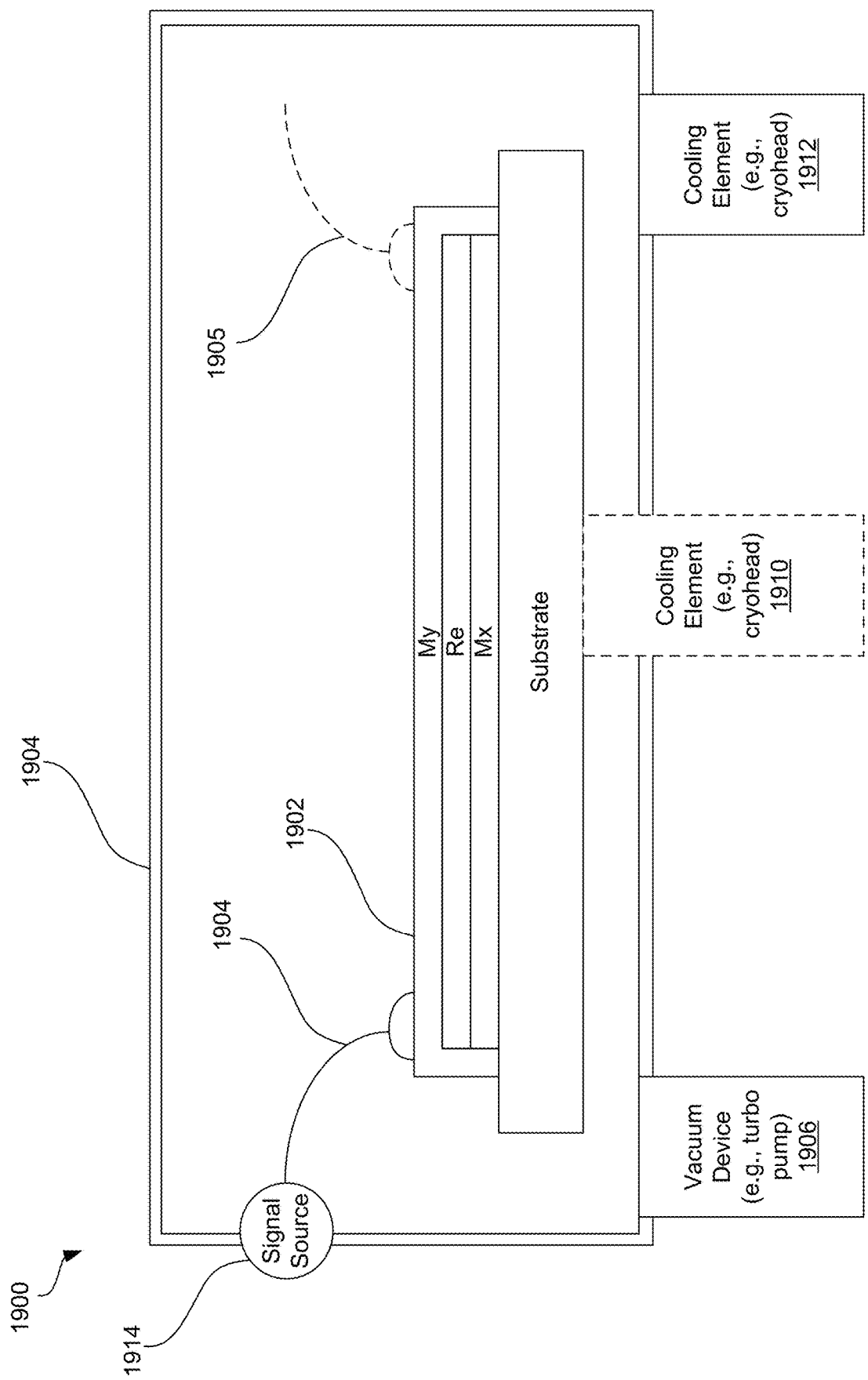

ENHANCED SUPERCONDUCTING TRANSITION TEMPERATURE IN ELECTROPLATED RHENIUM

CLAIM OF PRIORITY UNDER 35 U.S.C. § 119

The present application for patent is a Continuation of U.S. patent application Ser. No. 16/919,505 entitled "Enhanced Superconducting Transition Temperature in Electroplated Rhenium" filed Jul. 2, 2020, which is a Continuation of U.S. patent application Ser. No. 16/289,599 entitled "Enhanced Superconducting Transition Temperature in Electroplated Rhenium" filed Feb. 28, 2019, now U.S. Pat. No. 10,741,742 which issued Aug. 11, 2020, which claims priority to Provisional Application No. 62/636,611 entitled "Enhanced Superconducting Transition Temperature in Electroplated Rhenium" filed Feb. 28, 2018, as well as Provisional Application No. 62/727,825 entitled, "Enhanced Superconducting Transition Temperature in Electroplated Rhenium" filed Sep. 6, 2018. These applications are assigned to the assignee hereof and hereby expressly incorporated by reference herein.

STATEMENT REGARDING FEDERALLY SPONSORED RESEARCH

This invention was made with government support under Grant Number 70NANB14H095 awarded by NIST. The government has certain rights in the invention.

FIELD OF THE DISCLOSURE

The present disclosure relates generally to superconductors. In particular, but not by way of limitation, the present disclosure relates to systems, methods and apparatuses for electroplating Rhenium and operating resulting devices in a superconducting regime.

DESCRIPTION OF RELATED ART

In all subsequent references, the terms "Rhenium" and "Re" are interchangeable and refer to any pure rhenium film or alloy thereof.

Versatile superconducting materials are important in order to continue the progress of high speed classical [1-4] and quantum computers [5] as well as a wide range of information technology and low temperature research in general. In particular, it is important to develop materials that are readily transferable to manufacturing, i.e., that can be used in combination with standard fabrication and interconnect techniques to reduce power dissipation and heating. Another critical metric is a relatively high critical temperature ($T_c$). With the advent of low-power, closed cycle cooling platforms, it is straightforward to obtain temperatures down to 2.2 K [6, 7], while the 4.2 K liquid-He barrier is more relevant to general-purpose low temperature measurements. In either case, it is desired that the critical temperature ($T_c$) be well above the base or operating temperature in order to maintain a high critical current and avoid loss due to quasiparticles.

To that end, there is a small subset of existing superconducting materials that can be used for this application. In general, state-of-the-art materials include Nb and its binary and ternary alloys such as Nb—N, Nb—Ti and Nb—Ti—N. These materials all are useful in terms of high $T_c$, can be used in bulk or deposited as thin films, and can be connected using ultrasonic-wirebonding techniques. However, they tend to be difficult to work with mechanically and have poor soldering properties due to strong oxidation. While workarounds to these problems exist, they are not easily integrated into standard circuit fabrication.

Other typical materials (e.g., Pb, In, Sb, Al, Re, high $T_c$ oxides, etc.) suffer from toxicity, low melting temperatures, low critical temperatures, oxidation, contact resistance, can't be deposited via aqueous electroplating, incompatibility with wirebonding/soldering, incompatibility with multilayer circuit boards. To date, no one solution has emerged that addresses all the desired properties.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some embodiments of the disclosure may be characterized as a superconducting circuit system comprising: a means for maintaining a vacuum; a means for maintaining the circuit at or below 4.2 K; a substrate; a first conductive layer bonded to the substrate; a second Re layer; and a third conductive layer. The second Re layer can be bonded to the first layer via electroplating. The second Re layer can also have a thickness of between 10 nm and 1000 nm, and can be patterned to create at least a portion of the superconducting circuit. The third conductive layer can be bonded to the second Re layer and can encapsulate the second Re layer. The first, second, and third layers can optionally be patterned to form a portion of the superconducting circuit. Further, the encapsulation of the Re layer can be done to prevent oxidation of a surface of the Re layer.

Other embodiments of the disclosure may also be characterized as a method of fabricating a superconducting circuit that is superconducting at or above 4.2 K. The method can include providing a substrate; applying a first conductive layer onto the substrate; electroplating a second Re layer above the first layer to a thickness of between 10 nm to 1000 nm; applying a third conductive layer onto the second Re layer and encapsulating the second Re layer to prevent oxidization of the second Re layer; making a wire bond or solder connection between the third layer and another circuit; and arranging the superconducting circuit within a vacuum chamber configured to cool the superconducting circuit to at least 4.2 K. The first, second, and third layers can optionally be patterned to form a portion of the semiconducting circuit.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 3(*b*) shows a magnetic hysteresis loop measured at T=1.8 K;

FIG. 19 illustrates a superconducting circuit system.

DETAILED DESCRIPTION

Figure 1A:
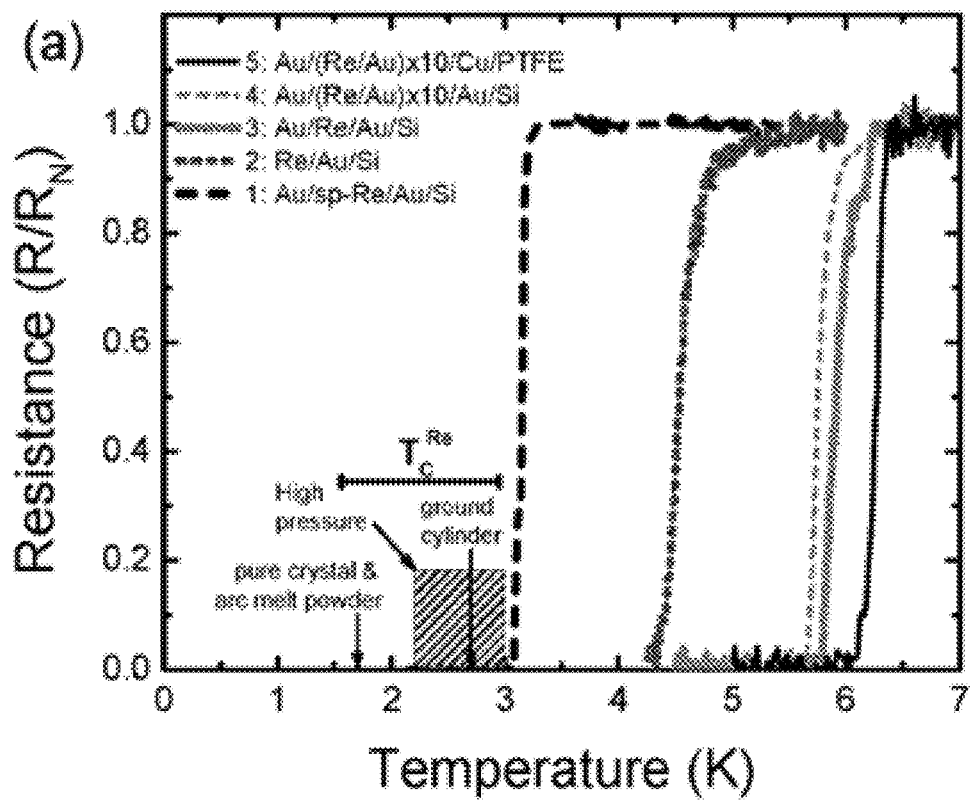
FIG. 1a illustrates data from References 10, 12 showing $T_c$(Re) from the literature.

Preliminary note: the flowcharts and block diagrams in the following Figures illustrate the architecture, functionality, and operation of possible implementations of systems and methods according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

One superconducting element in the group that suffers from low critical temperatures, Re, stood out as a promising candidate for improvement of the critical temperature, $T_C$. Re is a transition metal that is resistant to oxidation with a high melting temperature of 3186° C. [8]. It is used widely in various industrial and scientific applications such as strengthening materials and in high temperature thermocouples. While epitaxial Re can be used for low-loss RF-resonators in qubit circuits [9], it has no specific advantage over other more traditional superconducting materials. In particular, the critical temperature of crystalline-Re is relatively low, $T_c$(Re) 1.7 K [10].

The word "exemplary" is used herein to mean "serving as an example, instance, or illustration." Any embodiment described herein as "exemplary" is not necessarily to be construed as preferred or advantageous over other embodiments.

This disclosure describes superconducting circuits (including superconducting circuit boards, electronic devices, systems of electronic devices), and methods of manufacturing superconducting circuits, where the superconducting circuits (hereinafter "circuits") exhibit either a high critical temperature $T_c$ (e.g., higher than 1.8 K for annealed Re films and greater than 4.2 K for unannealed films). In an embodiment, the circuit can include at least one conductor or lead (hereinafter "conductor"), wherein the conductor is formed from "multilayers," where each multilayer includes a buried Re layer electroplated on another conductor that is compatible with electroplating. Examples of such conductors include, but are not limited to, Cu, Au, Pt, Pd, Ni, Rh, Ru, or conductive seed layers on various substrates including metal, PTFE, FR4, plastic, Si, system-on-chip, sapphire, quartz, doped semiconductor, or polyimide. The increased $T_c$ in Re layers electroplated on non-ferromagnetic conductors such as Au, is unexpected [10-12]. However, because pure Re is immiscible (e.g., less than 1% or less than 0.1%) in standard microelectronics metals (e.g., Cu, Au, Pt, Pd, Ni, Rh, Ru) it forms a discrete film when electroplated on standard microelectronics metals such as Au and Cu. In other words, some superconducting materials alloy with standard microelectronics metals, and the resulting alloy may lose superconductivity or result in a degraded superconductor (e.g., lower $T_c$).

For Re films, if annealed, the $T_c$ can be 1.8 K. Although this $T_c$ is lower than for non-heated Re films, this lower $T_c$ is still useful for applications at very low temperature (less than 100 mK). However, an electroplated Re film that is not annealed can exhibit $T_c$ greater than 4.2 K, meaning that it can be used with mere liquid He coolant. Refrigeration vessels, coolants, complexity, and time to cool are all improved at 4.2 K over very low temperature applications (e.g., 2.2 K), and so the discovery of a high-$T_c$ film that can be electroplated via aqueous solutions is highly valuable to the industry. This enhanced/increased $T_c$ may be due to the amorphous structure of the Re film, hydrogen incorporation in the Re film, or strain in the Re film, or a combination thereof. In an embodiment, once the third conductive layer is applied, the superconducting circuit can be annealed at 100-150° C. for 1-10 minutes. However, annealing at greater than 150° C. for any length of time may degrade $T_c$.

Another unexpected aspect of electroplating Re on certain conductors is that Re is relatively immiscible with, common microelectronics conductors, for example Cu, Au, Pt, Pd, Ni, Rh, Ru. For instance, the herein disclosed electroplated Re may experience less than 1% or less than 0.1% miscibility with adjoining layers formed from common microelectronics conductors such as Cu, Au, Pt, Pd, Ni, Rh, Ru. For instance, see "Constitution of Binary Alloys, Max Hansen; Rodney P Elliott; Francis A Shunk; Research Institute. New York, McGraw-Hill, 1958."

Re may form surface oxide films when exposed, and thus finishing the multilayer with a layer other than Re can improve performance. For instance, in a Mx-Re-My multilayer structure, where "Mx" and "My" denote some metal other than Re and Mx can be the same metal as My, the final layer My, can be some metal that resists oxidation (e.g., Au). The Mx and My layers need not be the same.

A multilayer can be described as a sandwich of a conductor, Re, and a conductor or Mx-Re-My. Multilayers comprise two or more of these Mx-Re-My sandwiches. The thickness of each Re layer can be less than 200 nm. For instance, the Re layer thickness can be less than 150 nm, or less than 100 nm, or less than 75 nm, or less than 50 nm, or less than 25 nm. Cracks in the Re layer may occur if the Re layers are too thick. Alternatively, if the Re is too thin it will not be superconducting due to proximization from the capping layer. Accordingly, the Re layers can preferably be thicker than about 10 nm. In an embodiment, a conductor can include multilayers (e.g., 1-3), where a multilayer includes a Re layer and a conductor (e.g., Au) layer. For instance, 3 multilayers would include three Re layers and 3 conductor layers, arranged in alternating layers. 1-3 multilayers may be preferable for conductors used in DC circuits. In another embodiment, 3-10 multilayers may be implemented, for instance in RF circuits. In other embodiments, 10-20 multilayers can be implemented. In some circuits, certain conductors may have a first number of multilayers (e.g., 1-3), while other conductors have a second number of multilayers (e.g., 3-10 or 3-20). Each conductor layer can be between 50 nm and 500 nm. In one embodiment, deposition time can be used to control layer thickness.

In an embodiment, a Re layer can be electro-deposited (e.g., electroplated) using any method that results in a smooth, continuous film using a DC or pulsed power supply, and can be deposited at atmospheric pressure. The power supply can be set to a constant-current mode and at a power of, for instance, 8 A/dm². Electroplating can also use a potentiostatic control. In an embodiment, solutions with different concentrations of Re can be electroplated in different layers or in different locations throughout a circuit. The electroplating can occur within an aqueous solution containing 11 g/L of $KReO_4$ with the pH adjusted to 0.9 using, for instance, sulfuric acid. In an embodiment, the recipe in C. G. Fink and P. Deren, Trans. Electrochem. Soc. 66, 471 (1934) can be used. The anodes can be, but are not limited to, platinized titanium. Moderate stirring can be performed with a magnetic bar coated with polytetrafluoroethylene (PTFE). This stirring can occur on a hot-plate stirrer at temperatures of 25-30° C. In tests, the Re deposits were shiny and smooth, typically dark gray, with good adhesion. Test samples with a variety of layer compositions are reported in Table I below:

| Sample | Layer | | |
|---|---|---|---|
| | Bottom | Middle | Top |
| 1 Vacuum deposited trilayer on Si | 200 Au | 300 Re | 100 Au |
| 2 Electroplated bilayer on Si | 200 Au | 300 Re | n/a |
| 3 Electroplated trilayer on Si | 200 Au | 300 Re | 75 Au |

-continued

| Sample | Layer | | |
|---|---|---|---|
| | Bottom | Middle | Top |
| 4 Electroplated multilayer on Si | 200 Au | (20 Au + 75 Re) × 10 | 75 Au |
| 5 Electroplated multilayer on Cu/PTFE | 200 Au | (20 Au + 75 Re) × 10 | 75 Au |
| 6 Electroplated multilayer on Cu/PTFE | N/A | (500 Cu + 75 Re) × 5 | 500 Cu |
| 7 Electroplated multilayer on Cu/PTFE | N/A | (500 Pd + 75 Re) × 5 | 500 Pd |

TABLE I shows sample composition and thicknesses (nm). For sample 1, a quartz crystal thickness monitor was used. For sample 3 and 4, thicknesses were obtained directly from STEM. Samples 2, 5, 6 are nominal thicknesses based on times derived from 3 and 4. The Au, Cu, and Pd was grown using standard electroplating solutions with the exceptions being the Au metallization with a 5 nm Ti adhesion layer on the Si in 2-4, and the vacuum prepared trilayers for 1.

The multilayer can be formed or arranged atop a second conductor, which may or may not be identical to the conductor within the multilayer. For instance, a Re—Au multilayer may be formed or arranged atop a Cu layer. The combination of second conductor with a Re-My (where My is any preferred conductor as discussed earlier) multilayer above forms a conductor, and this conductor can be formed or arranged on a substrate (e.g., a circuit board made from FR4, PTFE, or polyimide, an integrated circuit, a doped semiconductor, or a System-on-Chip) such as Si or PCB to name two non-limiting examples. Sapphire, quartz, and PFTE are other possible, but non-limiting, substrate or circuit board materials. In other embodiments, the conductor may be free-floating or not formed/arranged on a substrate (e.g., tower-mounted power lines or conductors used in superconducting magnets). In these instances, the second conductor may have a circular or ovular cross section and have a multilayer formed around this inner second conductor such that the multilayer extends radially out from a longitudinal center of the second conductor. Such free-floating conductors can be a $5^{th}$ to $10,000^{th}$ of an inch in diameter. In some cases, the free-floating conductor may include multiple strands of conductor, each coated with one or more Re-My multilayers, where the multilayer-coated strands are wound around each other in a spiral arrangement to form a larger conductor bundle. In some cases, the Re-My-multilayer-coated conductors can be arranged as strands with NiTi or other type strands to form a larger hybrid conductor bundle. In the case of vias, the multilayer can be formed on an inside surface of the second conductor (e.g., see FIG. 16), since the second conductor forms a donut-shape within the via.

The resulting conductor (e.g., Re), whether as an isolated strand, or as part of a bundled conductor, a circuit, a circuit board, a flex circuit, an electrical device, or a system of electrical devices, is a Type-II superconductor (crystalline Re is a Type I superconductor) with high $T_c$, high critical-current densities, and low RF losses. Although high-$T_c$ often refers to critical temperatures above the liquid nitrogen 77 K point, for the purposes of this disclosure, "high-$T_c$" means a critical temperature above Rhenium's latent 1.7 K critical temperature. In some cases, electroplating Re causes a shift in $T_c$ up to as high as about 4.2 K, or 4.4 K, or 5.0 K, or 6.0 K, or 6.5 K. This shift is thought to be a byproduct of either hydrogen incorporation into the Re or that the Re becomes amorphous and/or strained, or any combination of these effects, that occurs during electroplating.

Once the multilayer is formed on the second conductor to form a conductor (or a bundled conductor, a circuit, a circuit board, an electrical device, or a system of electrical devices), heating or additional heating may occur (e.g., conductor bonding or annealing). Unexpectedly, the $T_c$ was found to improve, well above 4.2 K (the temperature of liquid helium) when annealing temperatures up to 100, or up to 150° C., were applied to the multilayer. However, above 150° C. the $T_c$ may begin to drop. Further, it was found that annealing between 100° C. and 150° C. could increase $T_c$ when applied for up to one hour (or up to 10 minutes), but degraded $T_c$ when heat was applied for longer than one hour. Test results showed up to a 0.4 K increase in $T_c$ via annealing with 6.3 K being the highest $T_c$ observed for the Re-My multilayers tested The herein disclosed circuit can comprise a multitude of the described conductors, connectors, and reactive and/or resistive components. The circuit can be arranged within a vacuum chamber, and a vacuum device can be used to create a sub-atmospheric or vacuum environment for the circuit. The circuit can be cooled to below the critical temperature of any Re-MX multilayers in the circuit. This critical temperature is typically about 2.2 K, or about 3.6 K, or about 4.0 K, or about 4.7 K, or about 5.5 K for circuits that have not been heated to higher than 150° C. for more than one minute, and less than 1.8 K for circuits that have been heated to higher than 150° C. for more than one minute. The critical temperature is often less than 5.5 K for circuits that have not been heated to higher than 150° C. for more than one minute. At the same time, the critical temperature can be enhanced, or increased, when electroplated Re is annealed to between 100° C. and 150° C. for 1-10 minutes. Heating above this range or for longer than one to ten minutes tends to degrade $T_c$. An assembly can include a cooling device, which along with a vacuum device, can achieve these low temperatures. In an embodiment, the system can include a multilayer-coated conductor either free floating or on a substrate forming a portion of a circuit at sub-atmospheric pressure (e.g., vacuum) within a vacuum chamber where pressure is controlled by a vacuum device, and further where temperature is maintained within a range just above 2 K or 4 K by a cooling device.

To test the $T_c$ and other values of the herein disclosed multilayers, the inventors first grew a reference, Sample 1, of Au/Re/Au/prime-Si in vacuum using e-beam evaporation for the Au and sputter-deposition for the Re. This sample was used to compare against standard Re preparation methods.

Electroplated bilayers, trilayers, and multilayers of Re and Au where then grown on vacuum-prepared Au/Si substrates, Samples 2-4 in Table I. A 20 nm seed of electroplated Au was typically applied before the Re.

Finally, multilayers of Re/Cu/Re/Au, and Re/Pd were electroplated directly onto commercial Cu/PTFE circuit boards Samples 5-6. The boards were also patterned with resonators in order to test the RF properties of the multilayers. PTFE was used for its low loss tangent, tan δ=6.8× $10^{-4}$, at 15 K. J. Mazierska, M. V. Jacob, D. Ledenyov, and J. Krupk, in 2005 Asia-Pacific Microwave Conference Proceedings (2005), vol. 4, p. 2370.

Of particular concern in many low-temperature measurements is the DC-resistance and RF-loss that can create ohmic heating and degradation of quantum information. Therefore, the inventors characterized both types of transport properties. The measurements were conducted in both a liquid-He dewar-based system and an adiabatic demagnetization refrigerator (ADR). The samples on Si were measured with a dc 4-point probe. For the films on the 35-μm-thick copper traces, it was necessary to use ac-transport with a lock-in amplifier due to their low resistance.

The resistivity of the sputtered-Re layers on Si was measured on 0.6 mm slices cleaved from 5-mm-wide strips. The $T_c$ was taken to be the first inflection point in the R vs. T curves. Samples were contacted by either wirebonding (25 μm Al wire for low current measurements) or soldering (standard Cu wire for high current measurements). All samples could be soldered using 60:40 SnPb. No problems were encountered wirebonding to the thick Cu while for the Pd- and Au-capped samples Al wirebonds did not adhere as well.

Figure 1B:
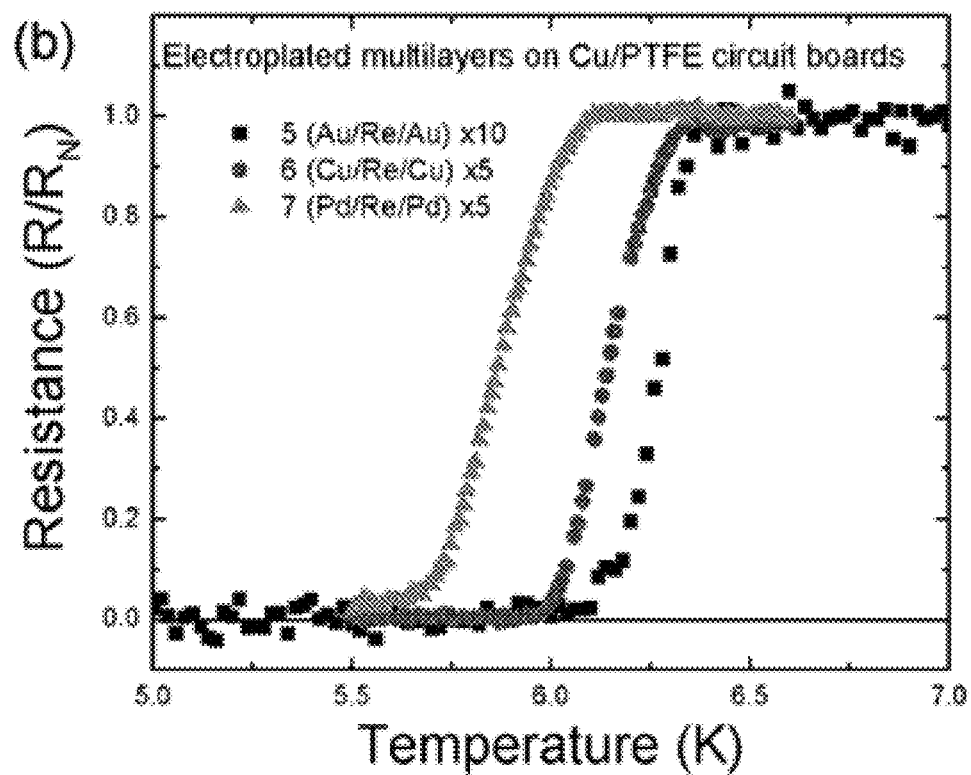
FIG. 1*b* illustrates a comparison of critical behavior for Re in Cu, Au, and Pd multilayers, for Samples 5-7.

Turning to the data, for the sputter-deposited Re samples the inventors saw a sharp transition to zero resistance in line 1 of FIG. 1(a), with $T_c$ slightly exceeding that of the highly strained Re from Reference 10. This can be attributed to Au—Re interfacial strain that tends to expand the Re unit cell. Subsequent high temperature annealing, up to 400° C., of this sample showed that $T_c$ is stable within 0.1 K. This is in line with the high melting temperature of Re and its immiscibility with Au [24-26]. FIG. 1 illustrates resistance vs. temperature. FIG. 1(a) illustrates data from References 10, 12 showing $T_c$(Re) from the literature. Curves show data from Au/Re samples described in Table I. FIG. 1(b) illustrates a comparison of critical behavior for Re in Cu, Au, and Pd multilayers, for Samples 5-7.

More surprisingly, and unlike the sputter-deposited Re samples, for the electroplated samples on Si, a progression of $T_c$ up to approximately 6 K was obtained. First, with the Re/Au bilayer sample in line 2 of FIG. 1(a) (note that this is a non-capped bi-layer), the inventors measured a range of critical temperatures from T=4.3 K to 4.7 K. These samples tend to tarnish over a period of a few weeks due to the exposed Re surface. Therefore, the inventors moved to capping the samples with electroplated Au films (e.g., see lines 3-5 of FIG. 1(a). This resulted in more stable films and reproducible $T_c$ measurements. Moreover, $T_c$ in these layered samples increased to T>5.7 K, with multiple steps in the transition in some samples, as shown in line 3 of FIG. 1(a). Experiments on these films, including sputtering the top Au film off and using much thicker Au layers, tend to depress the $T_c$. Subsequent samples grown as multilayers on Si, line 4 of FIG. 1(a), demonstrated even higher reproducibility and enhancement of $T_c$.

The inventors then looked at the multilayered films on commercial circuit boards, line 5 of FIG. 1(a). Here, as T decreases one sees the first drop in the resistance for $T_c$~6.1 K. However, there are slight steps in these transitions with low resistance tails. The tails go down an additional 0.1-0.5 K, depending on the current, before the transition to zero resistance.

In light of the variation of $T_c$(Re) (possibly due to strain), as outlined above, the properties of the Re grown with a series of metal films (e.g., Cu, Au, and Pd) was compared. These metals all share a close-packed structure, fcc, that is similar to the hcp structure of Re. However, the nearest-neighbor distance in the close-packed plane for these three is 0.256, 0.275, and 0.288 nm [27], respectively. This spans compressive, low, and expansive strain relative to the 0.274 nm near-neighbor spacing for elemental Re [27]. As shown in FIG. 1(b), all three types of multilayered films demonstrate the enhancement of $T_c$. Both Re/Au and Re/Cu have a sharp drop in resistance well above 6 K, whereas the Re/Pd samples have a slightly lower, more rounded transition. This may be due to the fact that Re, Cu, and Au are immiscible, while RePd tends to alloy [25].

Figure 2:
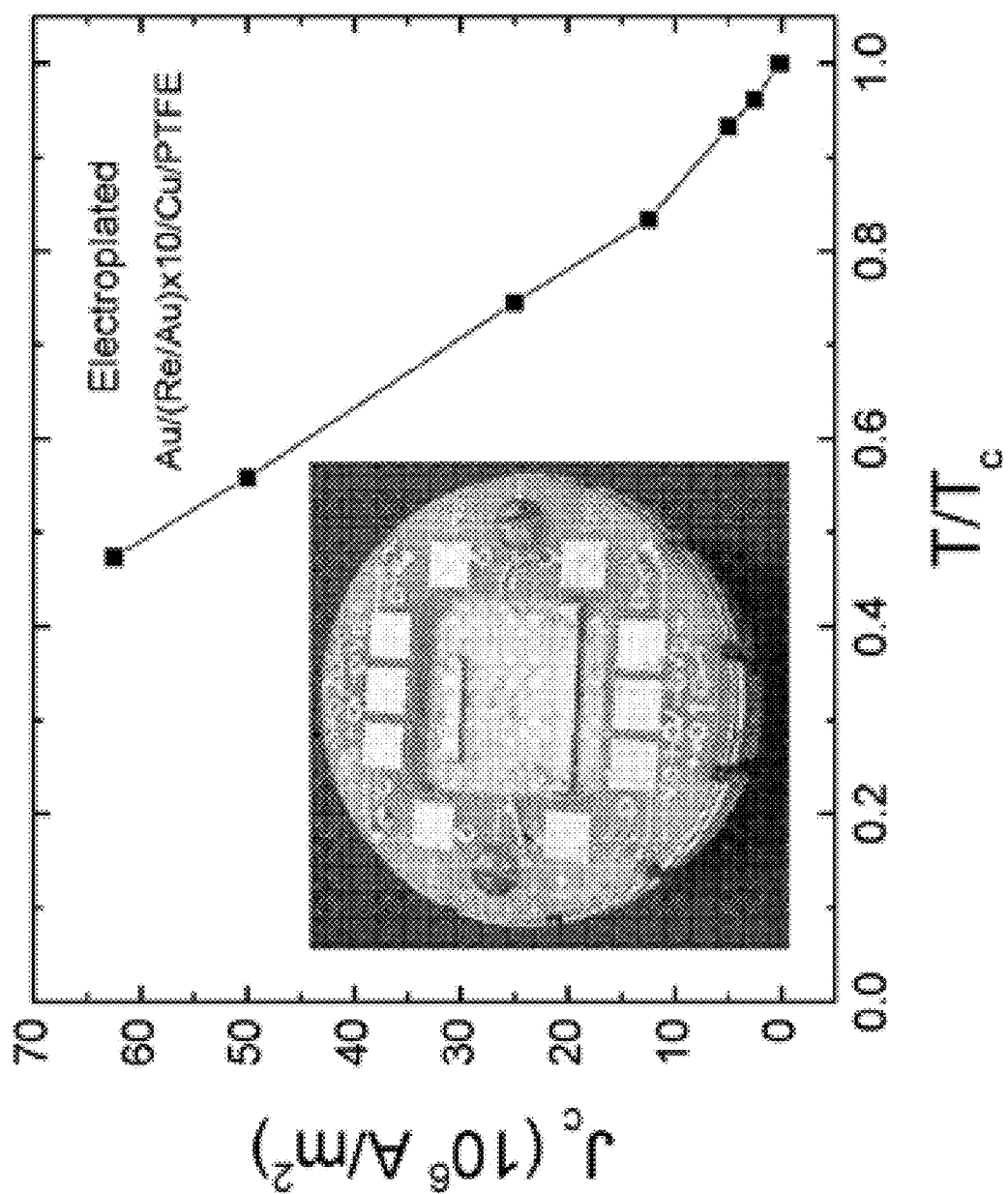
FIG. 2 illustrates critical current $J_c$ vs. normalized temperature $t=T/T_c$ for as-prepared electroplated multilayer, (Au/Re)×10/Au/PTFE, Sample 5 (10 multilayers of Re and Au atop an Au layer atop PTFE)

Versatility in connecting to the samples (e.g., soldering or wirebonding) was important in that this flexibility allows one to achieve good thermalization while high current densities, J are applied through the soldered contacts. In the same measurement, voltage leads could be wirebonded, as shown in the inset of FIG. 2. For samples on Si substrates the inventors measured critical current $J_c \sim 2.5$ to $5 \times 10^8$ A/m$^2$ for trilayers and multilayers, respectively. For films on Cu/PTFE, data in FIG. 2, the inventors saw lower $J_c$ $10^7$ A/m$^2$ due to the low temperature tails.

FIG. 2 illustrates critical current $J_c$ vs. normalized temperature $t=T/T_c$ for as-prepared electroplated multilayer, (Au/Re)×10/Au/PTFE, Sample 5 (10 multilayers of Re and Au atop an Au layer atop PTFE). The inset shows two samples mounted; bottom sample with current leads soldered for high currents and voltage leads wirebonded; top sample is wirebonded on both current and voltage leads.

While it is significant that the resistance drops to zero, it does not unequivocally demonstrate that the films are superconducting over their entire area. Magnetic measurements, which access two dimensions, are able to distinguish this behavior. For this study, the Au/(AuRe)×10/Si multilayer film, Sample 4, was cleaved into a rectangular sample, 5.0 mm×5.6 mm, for measurement in a magnetometer based on a superconducting quantum interference device (SQUID). In magnetic measurements of superconductors, the apparent magnetic moment is due to the field produced by shielding currents and trapped magnetic flux. The moment was measured in a perpendicular field of $\mu_0 H = 0.5$ mT as a function of increasing temperature after cooling in zero field (ZFC), and after cooling in a field (FC) of $\mu_0 H = 0.5$ mT, FIG. 3(a). The critical temperature, $T_c \sim 5.4$ K, is the end point of the broad transition from the shielding state to the normal state seen in the ZFC curve. The positive FC moment values for $T<T_c$ are indicative of an incomplete Meissner effect (incomplete expulsion of magnetic flux upon cooling below $T_c$), which is characteristic of type-II superconductors [28].

Figure 3A:
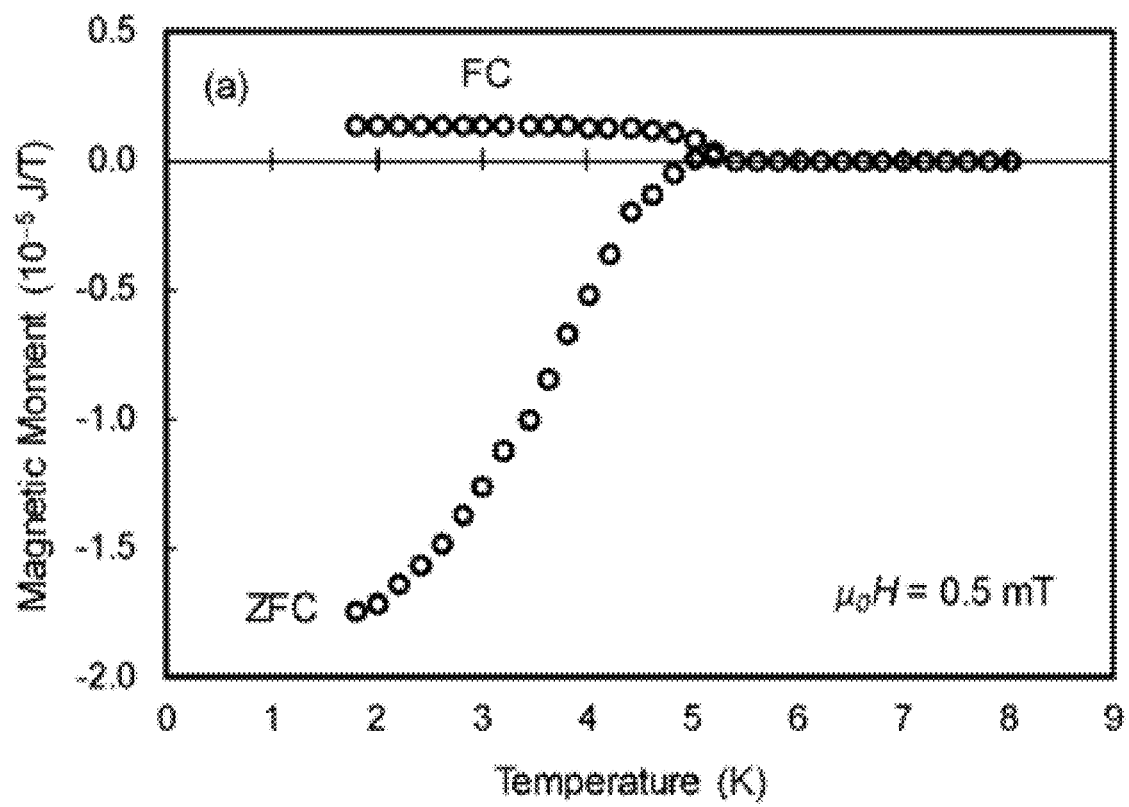
FIG. 3(*a*) shows zero-field cooled (ZFC) and field-cooled (FC) magnetic moment as functions of increasing temperature measured in $\mu_0 H=0.5$ mT.
Figure 3B:
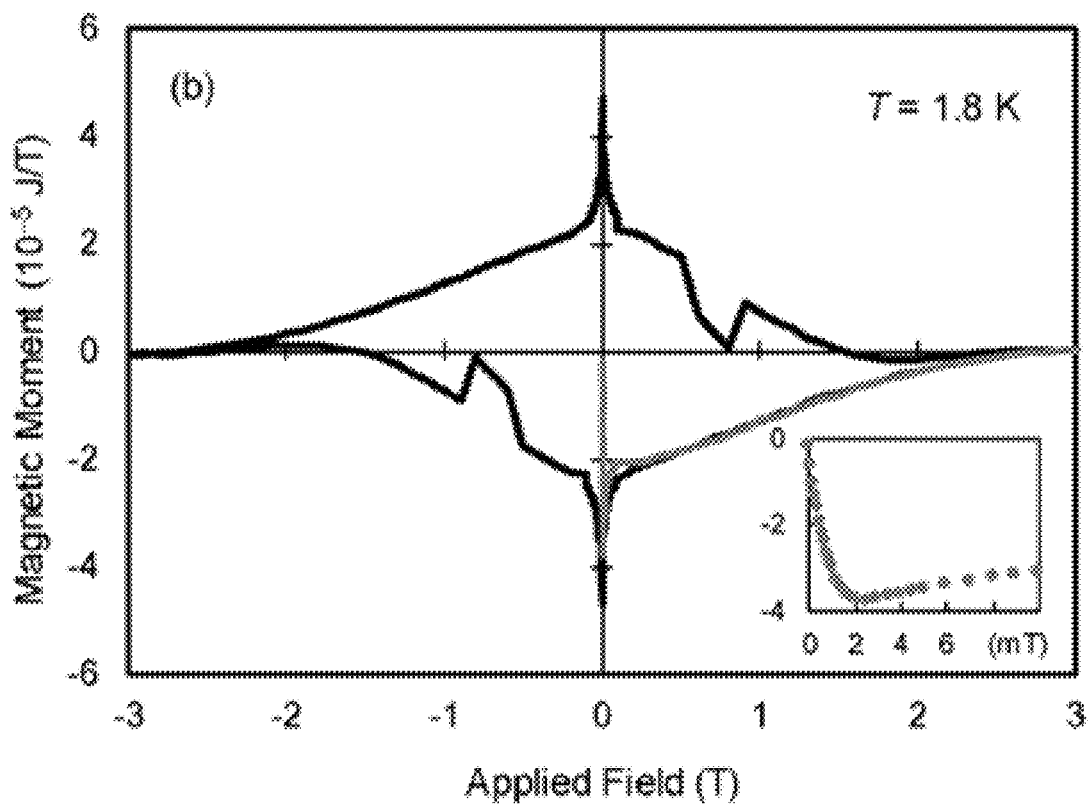

FIG. 3 illustrates a magnetic moment study of Sample 3. FIG. 3(a) shows zero-field cooled (ZFC) and field-cooled (FC) magnetic moment as functions of increasing temperature measured in $\mu_0 H = 0.5$ mT. The critical temperature is $T_c = 5.4$ K. FIG. 3(b) shows a magnetic hysteresis loop measured at T=1.8 K. The initial field is shown with an increasing curve. The upper critical field is $\mu_0 H_{c2} \sim 2.5$ T. The inset shows a detail of the initial curve, which suggests a lower critical field of $\mu_0 H_{c1} \sim 2$ mT A hysteresis loop of magnetic moment as a function of field was measured at T=1.8 K, FIG. 3(b). The shape of the loop is characteristic of type-II superconductors [28]. The magnetic moment approaches zero at an upper critical field $\mu_0 H_{c2} \infty 2.5$ T. Symmetrical flux jumps are evident in the descending branches of the hysteresis loop. A low-field detail of the initial curve is shown in the inset suggesting a small lower critical field $\mu_0 H_{c2}$ 2 mT.

Figure 4:
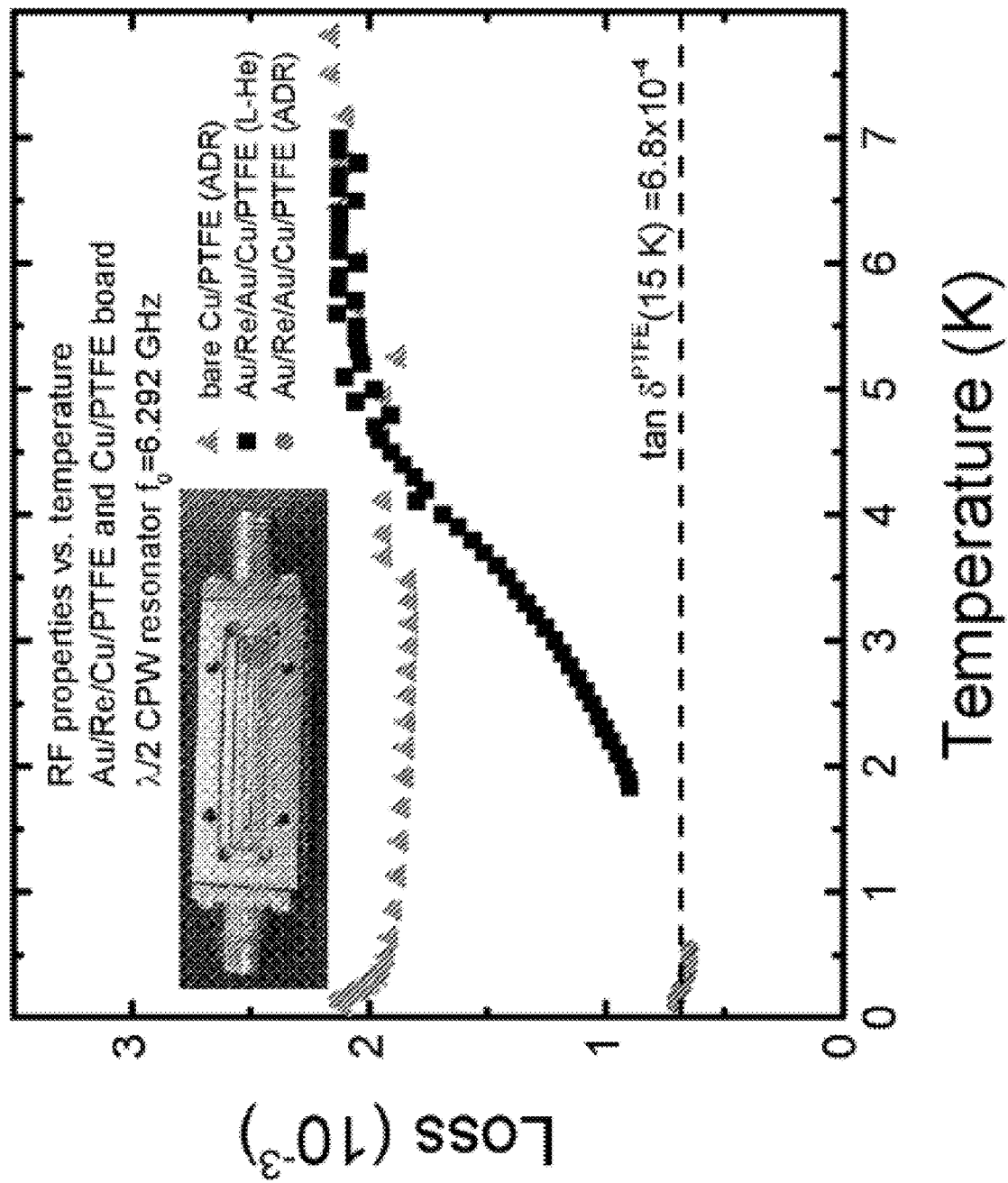
FIG. 4 shows a quality factor of Au/(Re/Au)×10/Cu/PTFE (Sample 5) compared to bare Cu/PTFE on a grounded coplanar resonator.

For most superconducting applications, notably SQUID magnetometry and quantum computing, it is also important to establish that the films maintain low loss at RF into the GHz regime. Therefore, resonator loss tangent, tan $\delta = 1/Q_T$ vs. temperature was compared for Au/Re plated (sample 5) vs. bare copper traces. Here, $Q_T$ is the total quality factor of the resonator. The samples were placed in a magnetically shielded environment and cooled to low temperature. The RF measurements were made using a vector network analyzer. The $Q_T$ was determined using a Lorentzian fit [29] to the resonance from a 18.2 mm×long grounded-coplanar-waveguide resonator on a 0.59 mm thick PTFE board. The width and gap of the resonator were 0.81 and 0.076 mm, respectively. The coupling quality factor of the resonator to the feedline, Qc $2 \times 10^4$. Because the $Q_T$ was significantly lower than Qc, the internal loss tan $\delta_i = 1/Q_i \sim 1/Q_T$, where $Q_i$ is the internal quality factor. As shown in FIG. 4, for the bare copper board tan $\delta_i \sim 2 \times 10^{-3}$ for T<8 K. Below about T=250 mK a slight increase appears. This increase is consistent with two-level system (TLS) loss [30], most likely in the PTFE.

For the Re/Au electroplated circuit board, on the other hand, a decrease for tan $\delta_i$ of T<5 K is seen in FIG. 4. This is expected in the case of a superconducting transition in the Re—Au plating. The loss drops to that of PTFE at low temperature [22], and the TLS increase appears again at very low temperature. This shows that the loss is limited by the material of the circuit board rather than the metal traces. Therefore, development of new, low-loss board materials is now an important consideration for these circuits. On the other hand, these data show that plating of metallic components will significantly improve their performance at RF as well as DC.

FIG. 4 shows a quality factor of Au/(Re/Au)×10/Cu/PTFE (Sample 5) compared to bare Cu/PTFE on a grounded coplanar resonator. The inset shows an Au/Re circuit board soldered in a Au-plated Cu box connectorized with SMA ports.

Preliminary STEM studies (see FIGS. 8-15) show high transmission through the Re layers with a striated pattern perpendicular to the plane. The inventors' own density-functional-theory calculations confirm the immiscibility of Au/Re and point to the possibility of an increase in the density of states near Ep as the Re lattice expands, in agreement with Reference 12.

There is a wide spectrum of components (e.g., circuits, circuit boards, electrical devices, interconnects, cables, and shields) that can immediately benefit from the herein disclosed superconducting electrodeposited Mx-Re-My multilayers, with the thickness of Re being typically 10 nm<t<1000 nm, and Mx and/or My being preferentially Au but can be any of a number of non-ferromagnetic, electroplateable metals such as Cu, Au, Pt, Pd, Ni, Rh, Ru. In other words, the non-ferromagnetic layers can be the same or different. In one embodiment, the base non-ferromagnetic layer, Mx, can be a first material, and all subsequent non-ferromagnetic layers, My, can be a second and different material. In this context, components include any part of a circuit configured to conduct electrical current, including, but not limited to: circuit boards (i.e. metalized dielectrics that may or may not be patterned), flexible circuit boards, conductors (long strands of conductors that may or may not be insulated), cables (bundles of conductors that may or may not be insulated), coaxial cables (either the center conductor is plated or both the shield and center conductor plated) (braided or semi-flexible), vacuum feedthroughs, resonance cavities, electrostatic shields, and any type of connector pins (either male or female) that go between components, including "fuzzbuttons". As another example, a superconducting integrated circuit may include components designed for magnetometry and/or thermometry for which it is desirable that the critical current be higher than it is for other components (e.g., processor components such as qubits) of the circuit. As another example, a superconducting integrated circuit may include certain components made of a first material or set of materials that produce less noise than other components made of a second material or set of materials. In some embodiments, the Mx and My layers may be electro-platable.

Components that are included fall into two general types that are used for different operational temperature ranges, $T_{op}$: (1) Components that have not been annealed or heated under conditions (e.g., above a certain temperature for a certain amount of time) that start to cause a reduction in $T_c$ (e.g., those that have been annealed or heated between 100° C. and 150° C. for 1-10 minutes, but no longer and no hotter)—these can be useful for operational temperature $0<T_{op}<6$ K; and (2) Components that have been annealed or heated under conditions (e.g., above a certain temperature for a certain amount of time) that start to cause a reduction in $T_c$ (e.g., those that have been annealed or heated above 150° C. and/or for longer than 1-10 minutes)—these can be useful for operational temperatures $0<T_{op}<2$ K.

An integrated circuit is typically fabricated over an area known as a chip or a die. In many instances, the density of circuit elements (i.e., the density of metal wiring) is not uniform over the area of the die. In multi-layered circuits involving at least one stage of planarization, these non-uniformities in wiring density can result in non-uniformities in the surface(s) of the various layers. For an evenly applied planarization force, the rate at which a dielectric layer recedes during planarization may depend on the composition of the underlying layer(s). That is, a portion of a dielectric layer that overlies a metal structure may recede at a different rate during planarization than a portion of the same dielectric layer that overlies another dielectric layer. For example, when a first dielectric layer that has a first portion carried directly on a metal layer and a second portion carried directly on a second dielectric layer is planarized, the resulting thickness of the first dielectric layer may not be uniform. In various embodiments, the non-uniformities in the planarized surface may include pits, steps, protrusions, and/or a general curvature. Such non-uniformities can adversely affect the deposition of subsequent layers and/or adversely affect the operation of the integrated circuit. In particular, non-uniformities in the thickness of a dielectric layer can introduce potentially detrimental parametric spreads in the devices included in the integrated circuit. In semiconductor fabrication practices, these non-uniformities may be mitigated by designing the integrated circuit to include idle (i.e., electrically inactive and unused) structures of filler metal in order to improve the uniformity of metal wiring density over the area of the die. In accordance with the present systems and methods, a similar approach may be adapted for use in superconducting integrated circuits, where the structures of filler metal are formed of a material that is superconducting below a critical temperature in order to avoid introducing unwanted sources of thermal energy and/or magnetic fields into the circuit.

In an embodiment, a series of Mx-Re-My multilayers can be deposited or grown on a substrate. In between multilayer deposition/growth, or after the complete set of multilayers is deposited/grown, one or more etching steps can be used to form conductors, bonding pads, electrical devices, and circuits via the multilayers. Mx-Re-My multilayers can be deposited/grown on the substrate, on an insulating or dielectric layer (e.g., $SiO_2$), or on a plurality of other layers such as a combination of dielectric and metal layers. In some embodiments, the Mx-Re-My multilayer can be deposited/grown on a semiconducting substrate that can be doped before or after Mx-Re-My multilayer deposition/growth. In some cases, a semiconducting device, circuit, or wire, can be electrically coupled to a superconducting conductor formed from Mx-Re-My multilayers, or a superconducting Mx-Re-My conductor can be deposited/grown between two or more circuits, electrical devices, and/or conductors formed from combinations of doped semiconductors, dielectrics, and/or conductors. In other words, electrical components formed from Mx-Re-My multilayers, and operated near or below $T_C$ for the Mx-Re-My multilayers, can be integrated with traditionally-fabricated electrical components.

Figure 5:
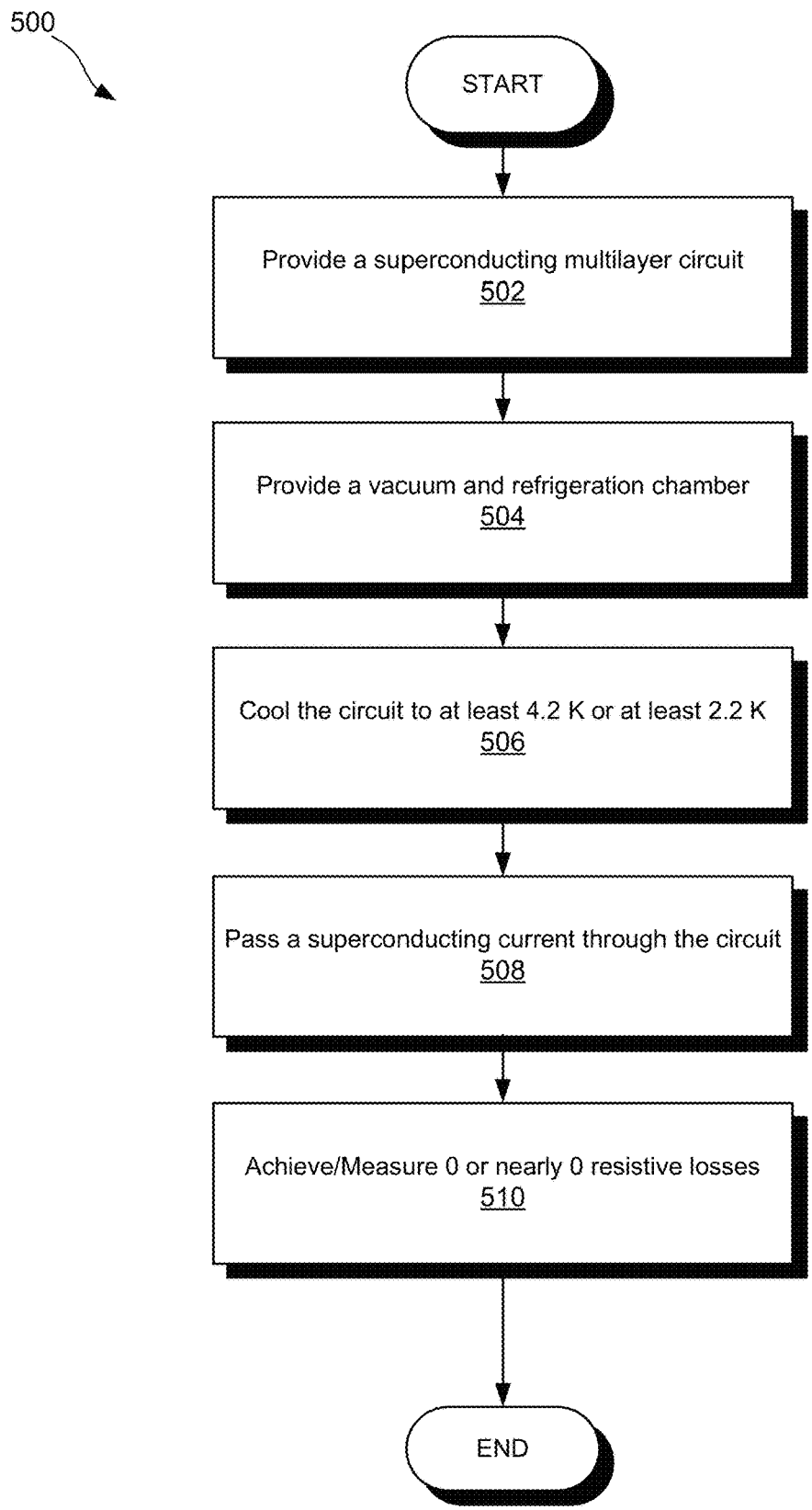
FIG. 5 illustrates an embodiment of a method for using a high-$T_c$ multilayer circuit.

FIG. 5 illustrates an embodiment of a method for using a high-$T_c$ multilayer circuit. The method 500 can include providing a superconducting multilayer circuit (Block 502) such as those described throughout this disclosure including at least a trilayer of a non-ferromagnetic conductor, Re electroplated to the underlying layer, and a capping layer of the same or a different non-ferromagnetic conductor. The method 500 can also include providing a vacuum and refrigeration chamber (Block 504) and cooling the circuit to at least 4.2 K or at least 2.2 K (Block 506). The method 500 can further include passing a superconducting current through the circuit (Block 508) and achieving 0 or nearly 0 resistive losses (Block 510). In some instances, one or more wire bonds and/or soldering connections can be made to the circuit and as such the topmost non-ferromagnetic conductive layer should be conducive to such bonds without structural degradation and without degrading or substantially changing the $T_c$ of the Re layer(s).

Figure 6:
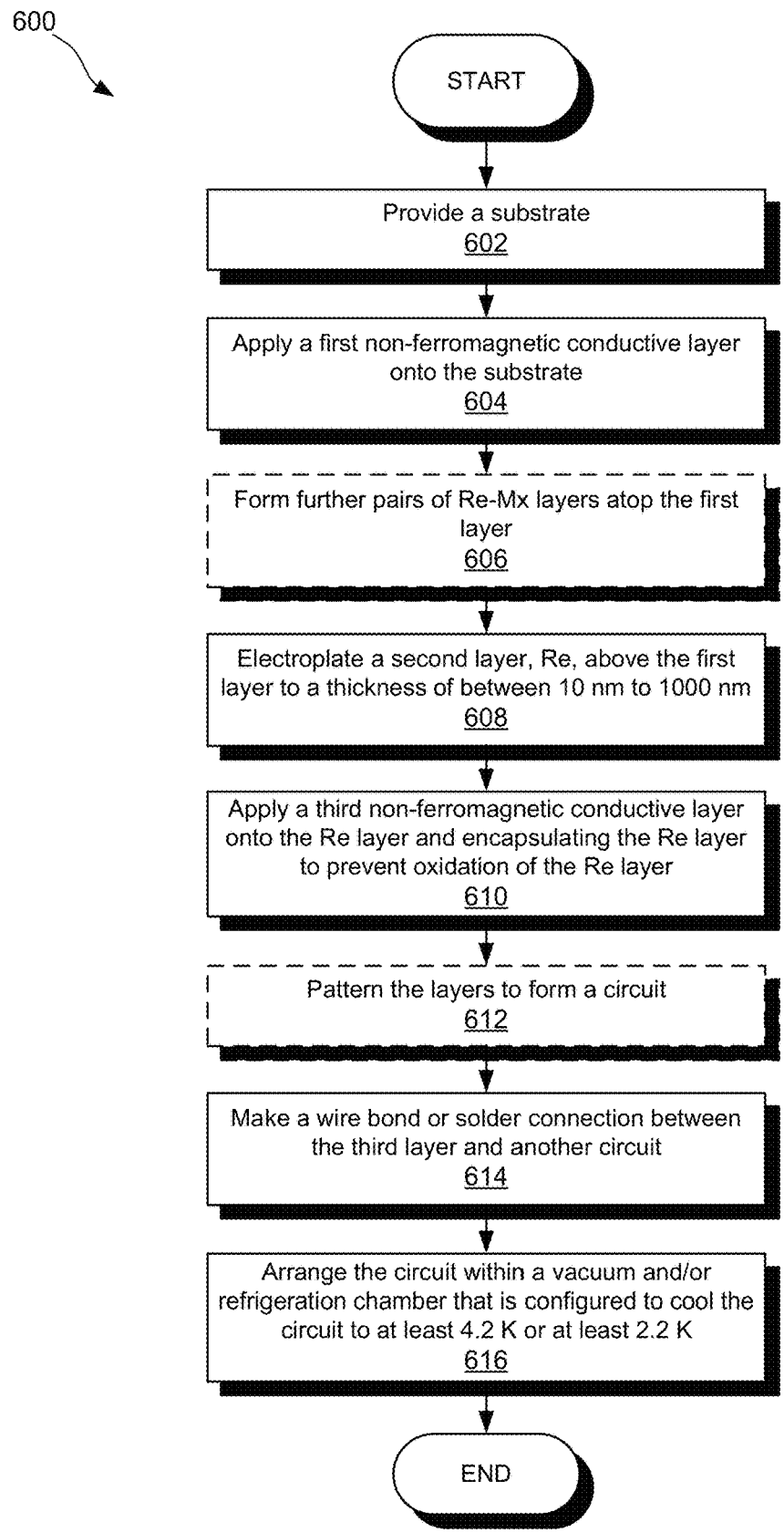
FIG. 6 illustrates an embodiment of a method for fabricating a superconducting circuit that is superconducting at or above 4.2 K.

FIG. 6 illustrates an embodiment of a method for fabricating a superconducting circuit that is superconducting at or above 4.2 K. The method 600 can include providing a substrate (Block 602) and applying a first non-ferromagnetic conductive layer onto the substrate (Block 604). The method 600 can further include electroplating a second layer, Re, above the first layer to a thickness of between 10 nm to 1000 nm (Block 608). The method can yet further include applying a third non-ferromagnetic conductive layer onto the Re layer and encapsulating the Re layer to prevent oxidation of the Re layer (Block 610). The second and third layers can form a Re-My pair, where My is any non-ferromagnetic conductive layer, and can be the same or different than the conductor of the first layer. Additional ones of this pair of layers can be formed between the first layer and the Re layer (optional Block 606) so that the eventual multilayer stack has the form Mx-(Re-My)*Z—Re-My, where "Z" is a number of additional Re-My pairs. Each My layer above an Re layer can encase the previous Re layer, or only the final My layer can encase all Re layers. Each layer can be patterned to form a circuit (Block 612) and a wire bond or solder connection can be formed between the third layer and another circuit (Block 614). The third layer material should be selected as a material that is immiscible with Re and has a high enough melting point to avoid structural degradation during wire bonding. The superconducting circuit can be arranged within a vacuum and/or refrigeration chamber that is configured to cool the superconducting circuit to at least 4.2 K or at least 2.2 K (Block 616). It should be noted that the electroplating of the Re layer(s) can be performed in an aqueous solution. Any layers bonded to a Re layer should be immiscible with the Re layer. Not all My layers need be the same, but the outermost or capping layer should be applicable to wire bonding, soldering connections, or other intended use, and preclude oxidation of any exposed Re layers.

Applying the first non-ferromagnetic conductive layer can be performed via various additive processes, such as electroplating, sputter deposition, and electroless plating, to name a few non-limiting examples. Examples of the first non-ferromagnetic conductive layer include, but are not limited to, Cu, Au, Pt, Pd, Ni, Rh, Ru. In an embodiment, the first layer can be deposited on a wall of a multilayer circuit board via. This can occur via electroless plating. Where proximitization of the first layer by the second layer, or whatever layer is bonded to the first layer, is desired, the first layer can be less than 100 nm or less than 60 nm thick.

Figure 7A:
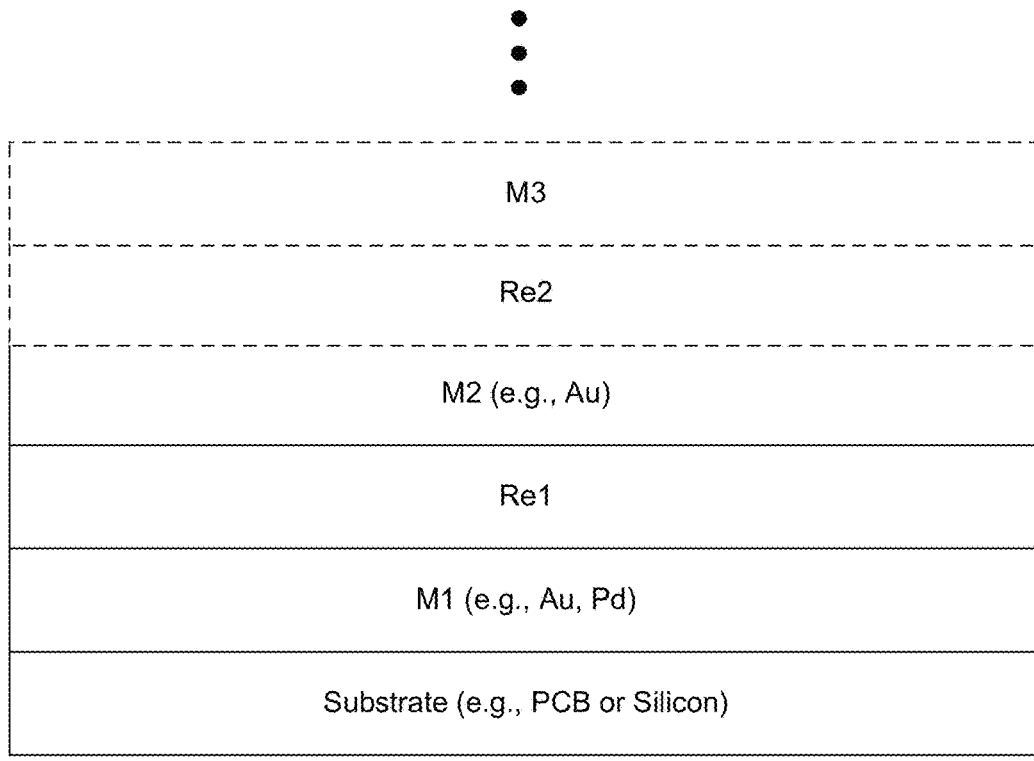
FIG. 7A shows a cross section of a multilayer planar structure, such as would be applied to a printed circuit board.
Figure 7B:
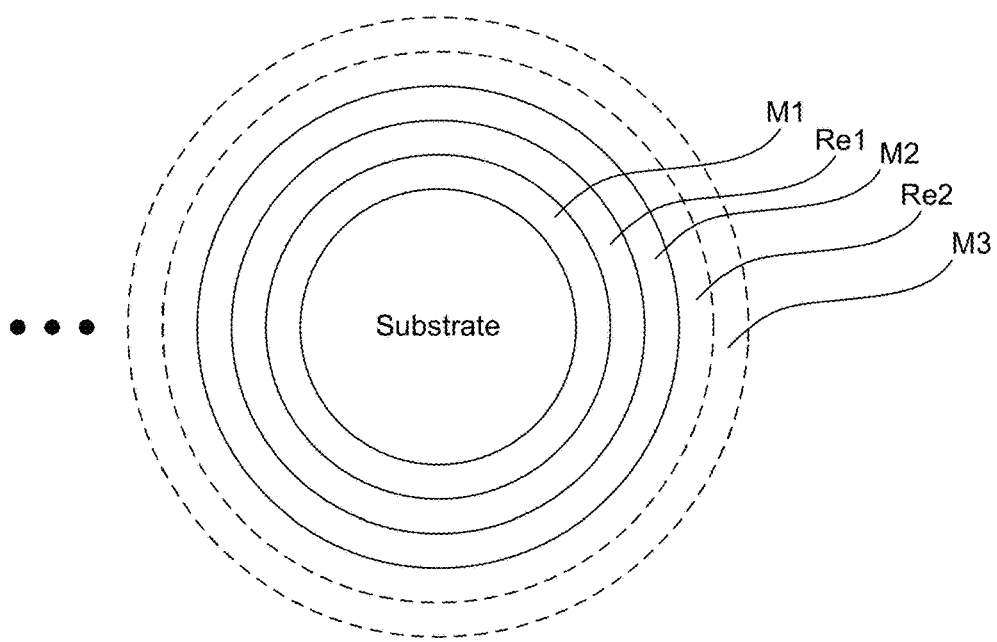
FIG. 7B shows a cross section of a multilayer planar structure such as would be applied to form a wire or cable.
Figure 8:
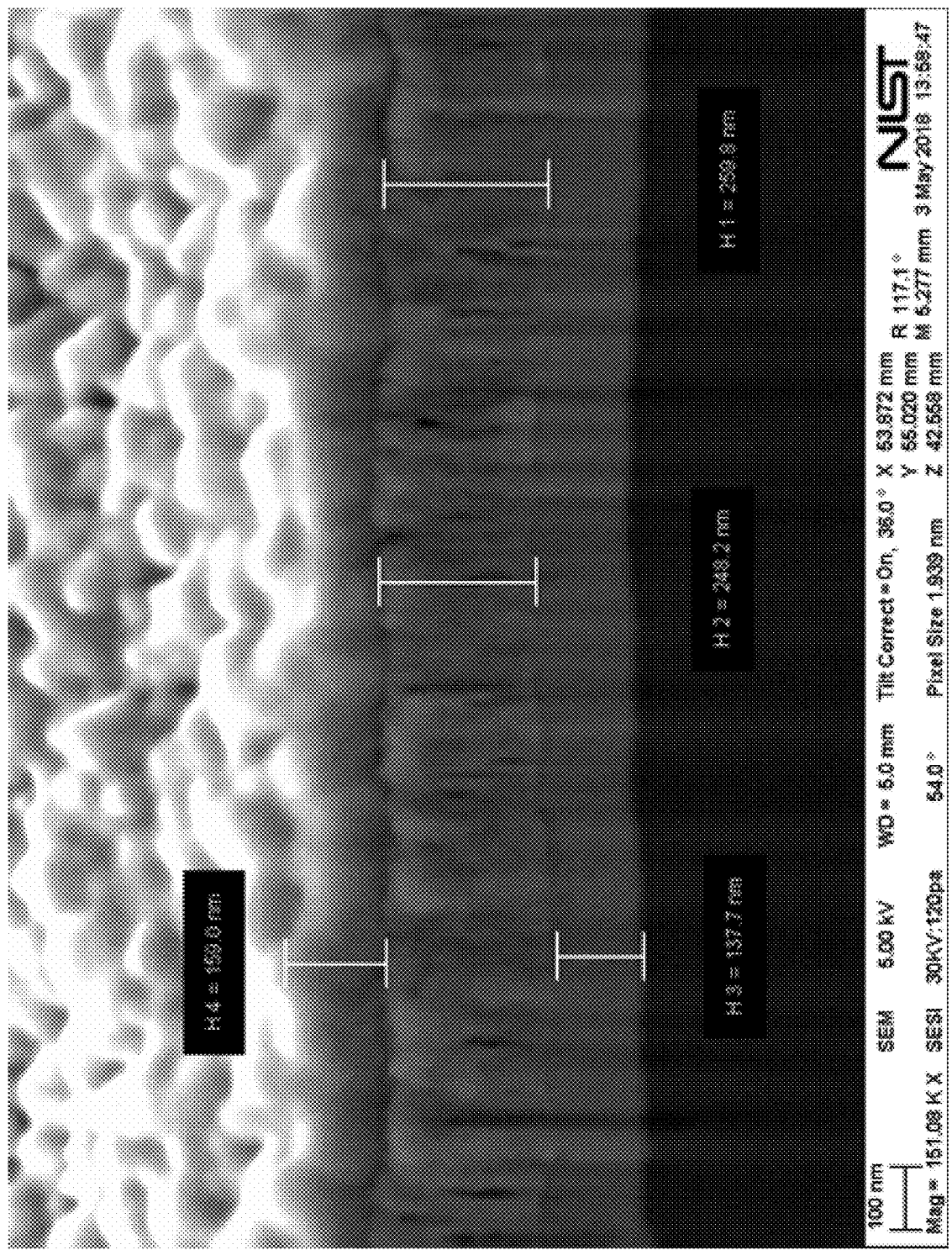
FIG. 8 shows a STEM image of an Mx-Re-My multilayer.
Figure 9:
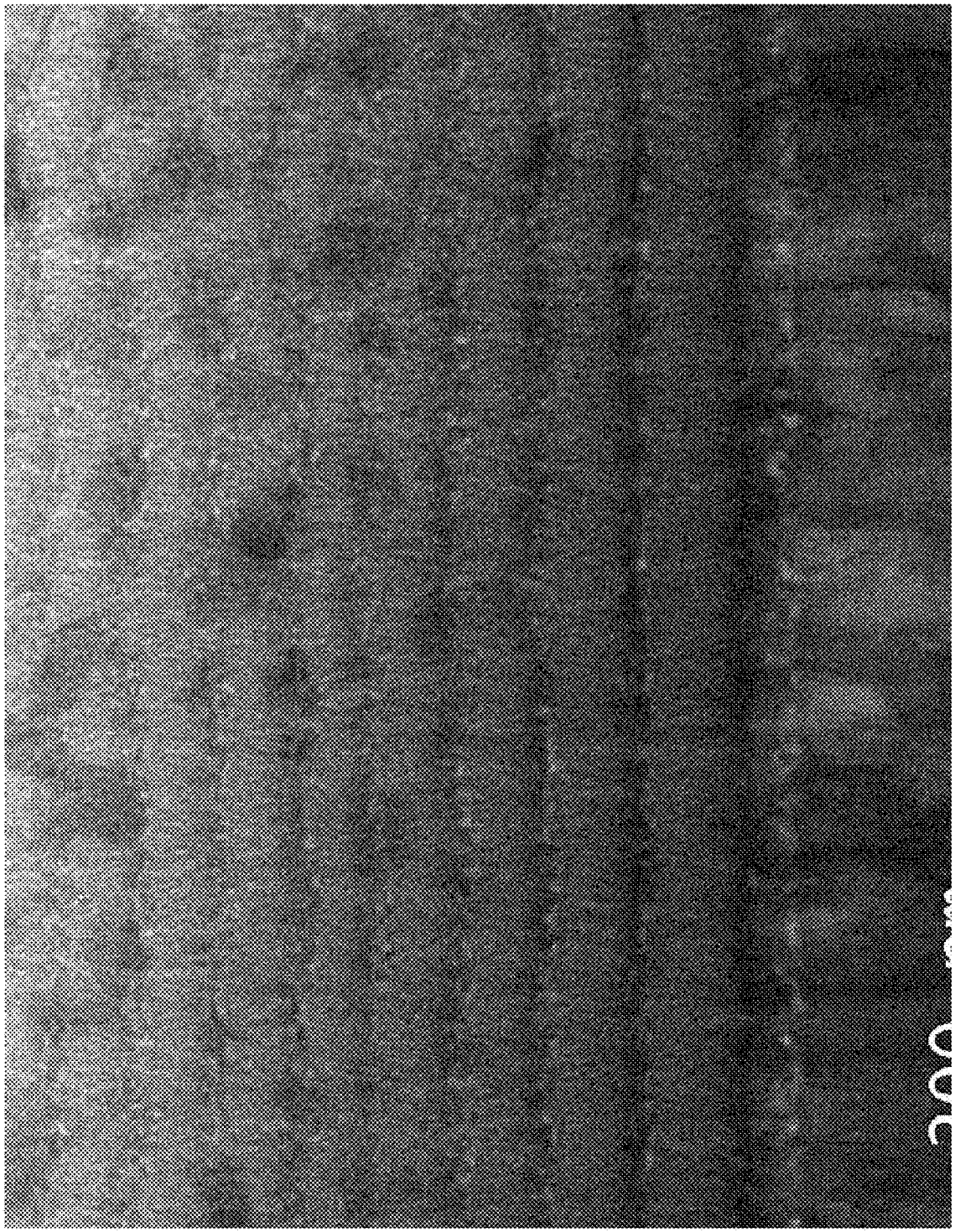
FIG. 9 shows another STEM image of an Mx-Re-My multilayer.
Figure 10:
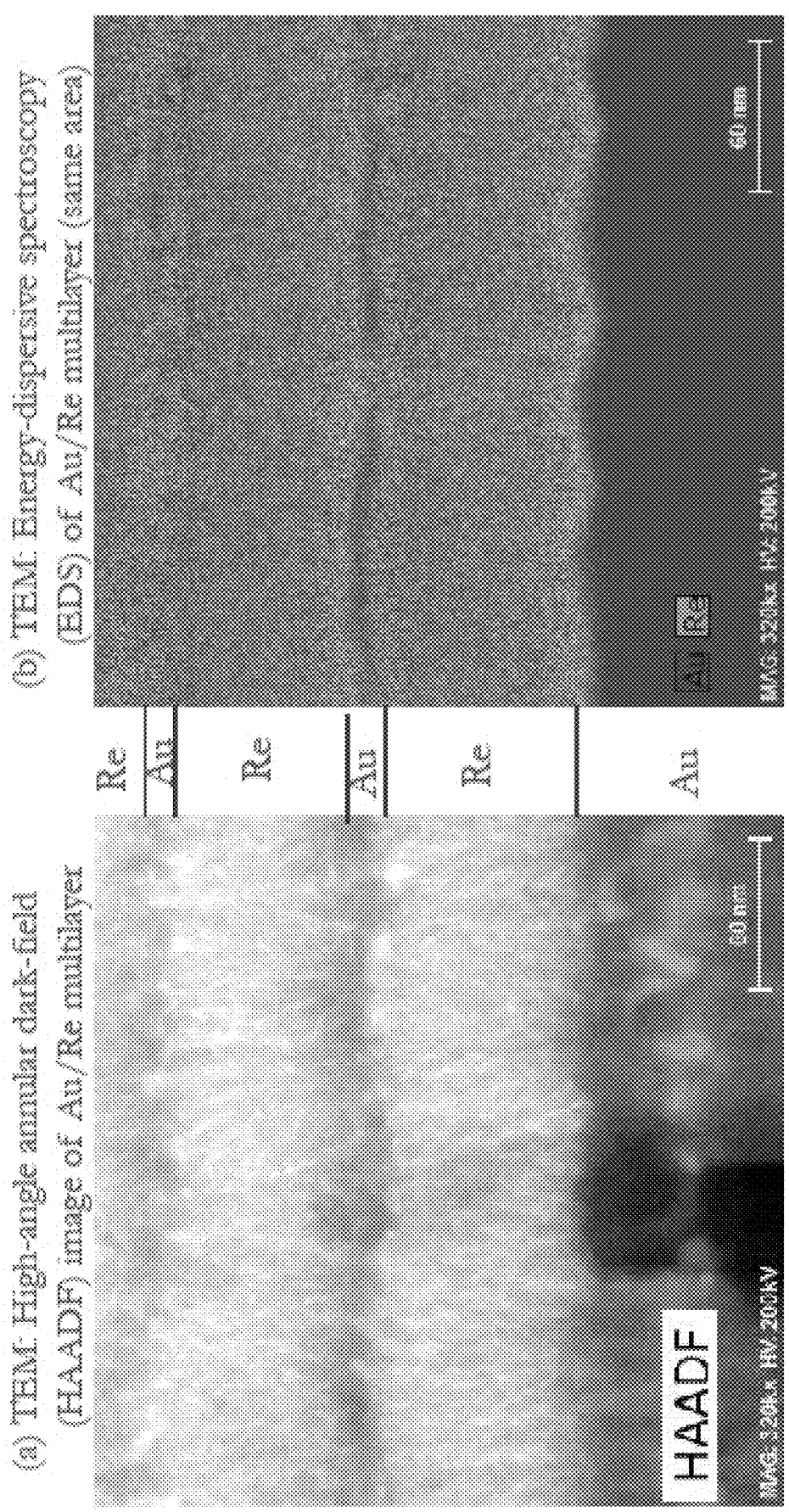
FIG. 10 shows a pair of TEM images of an Mx-Re-My multilayer.
Figure 11:
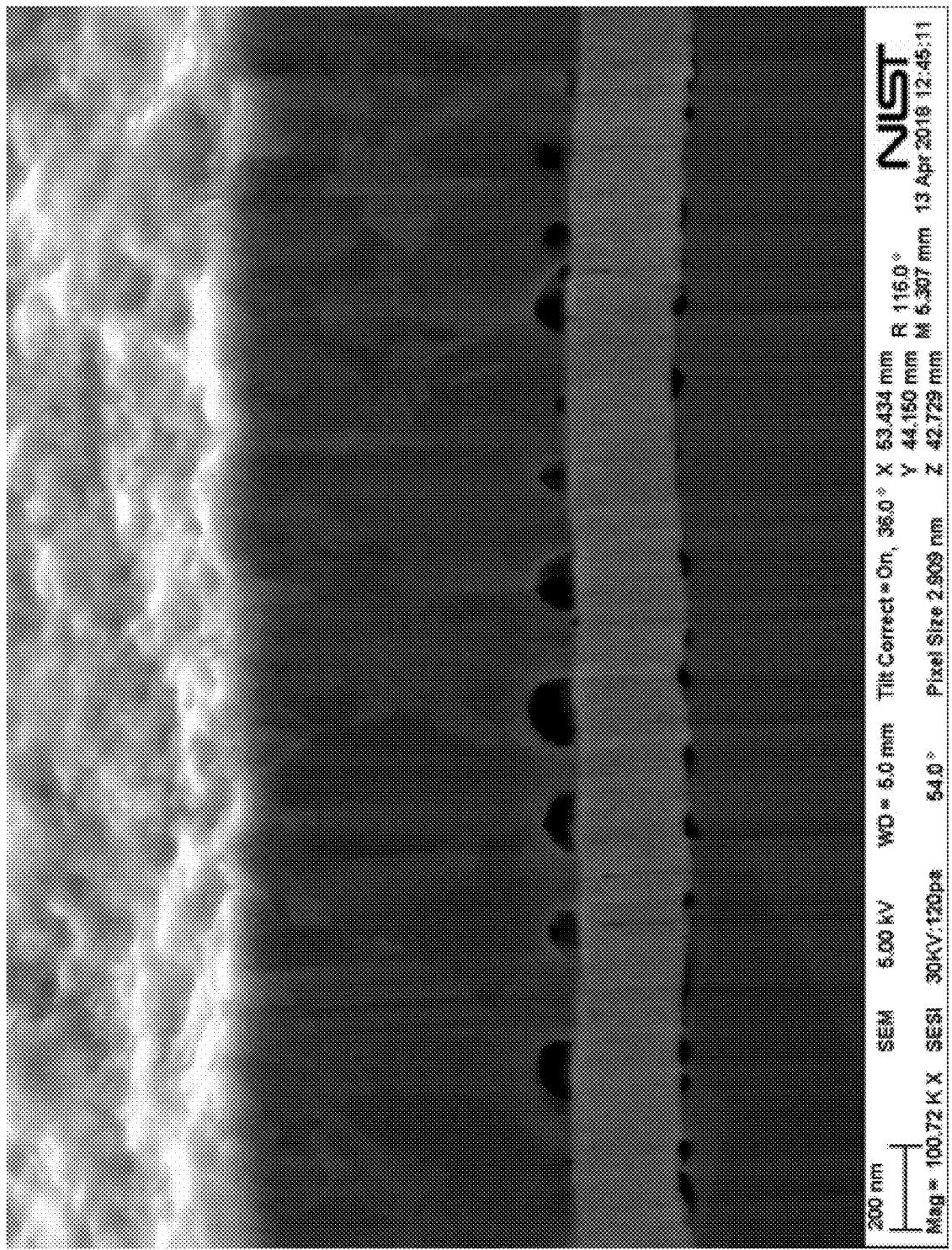
FIG. 11 shows another STEM image of an Mx-Re-My multilayer.
Figure 12:
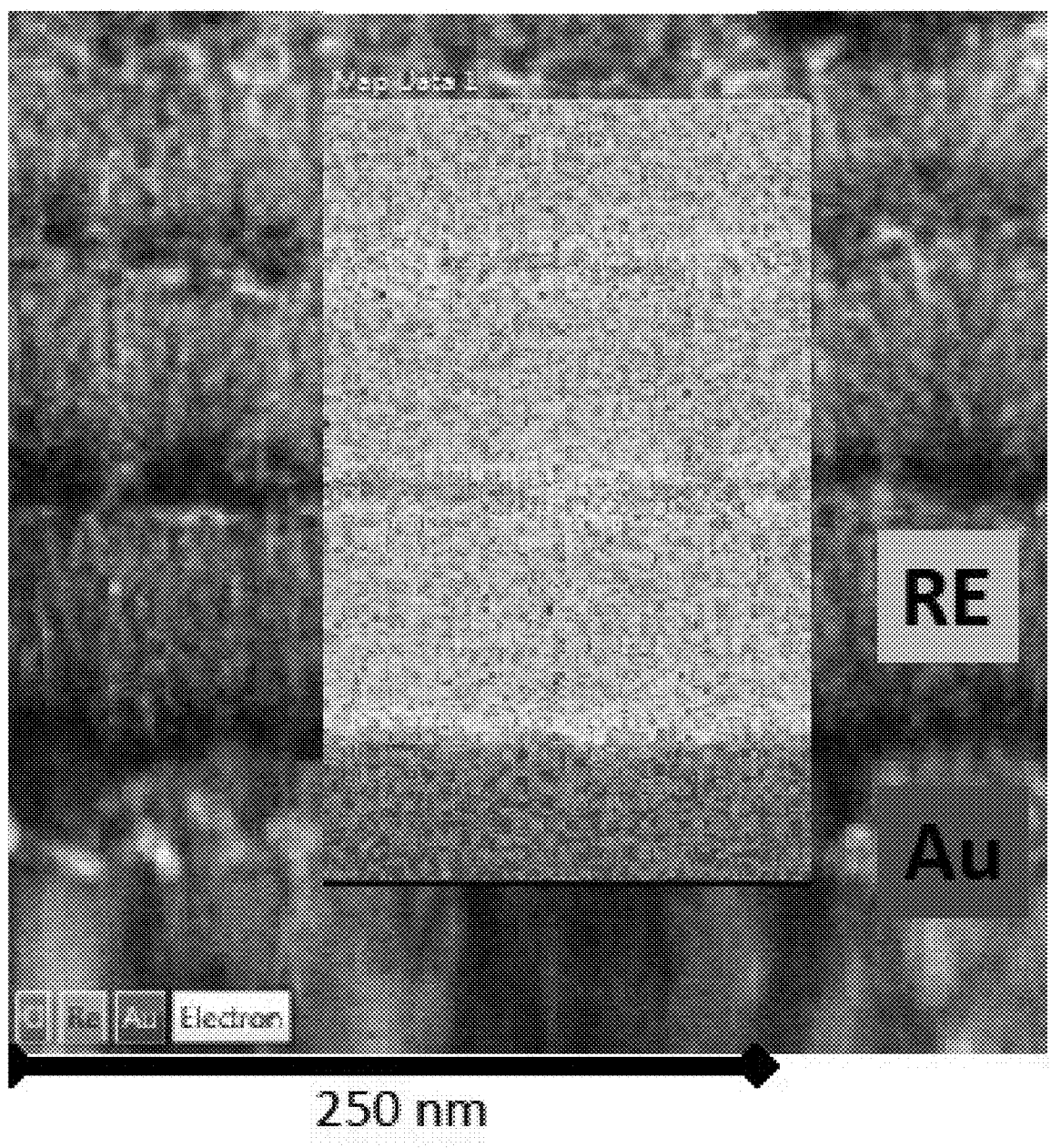
FIG. 12 shows another STEM image of an Mx-Re-My multilayer.
Figure 13:
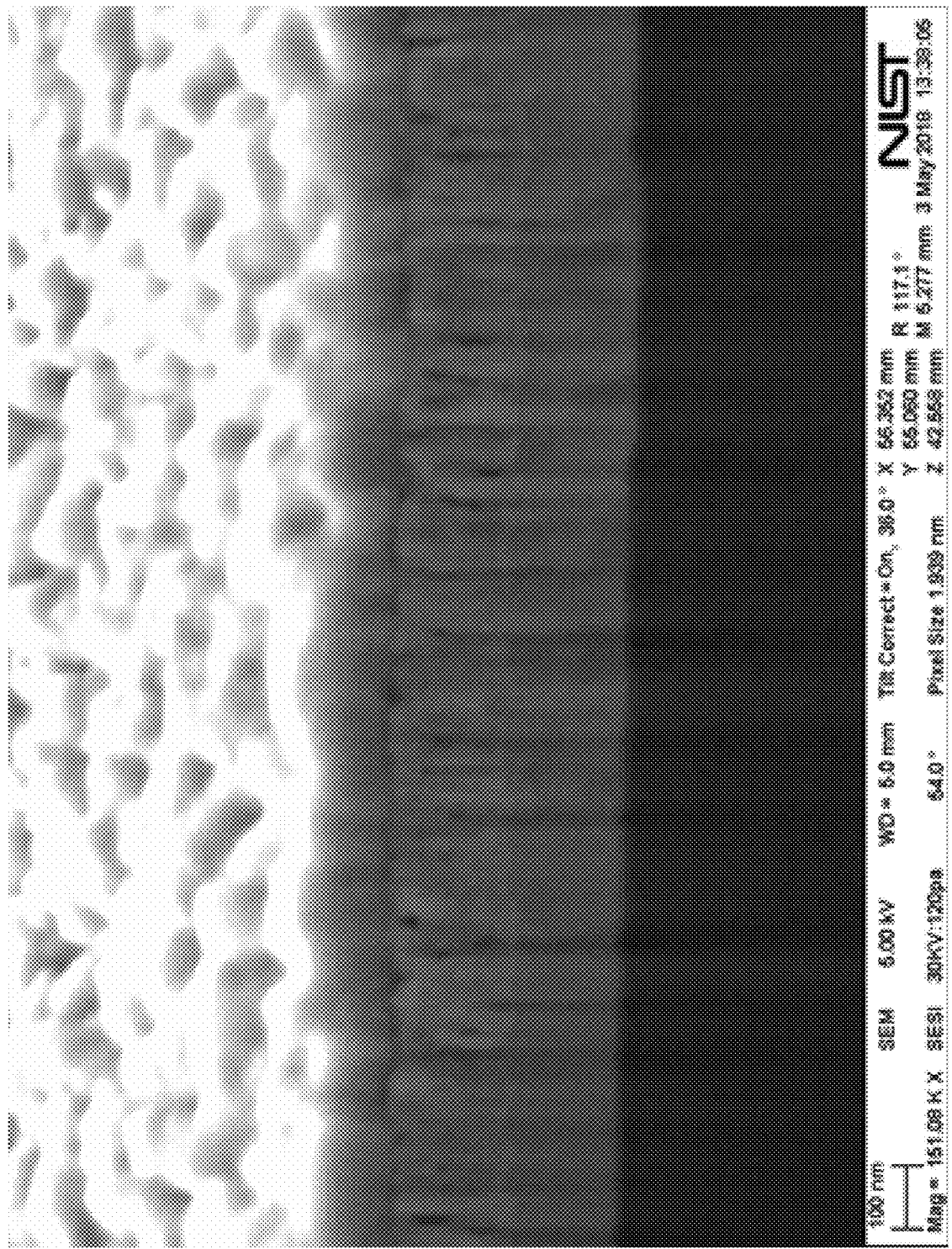
FIG. 13 shows another STEM image of an Mx-Re-My multilayer.
Figure 14:
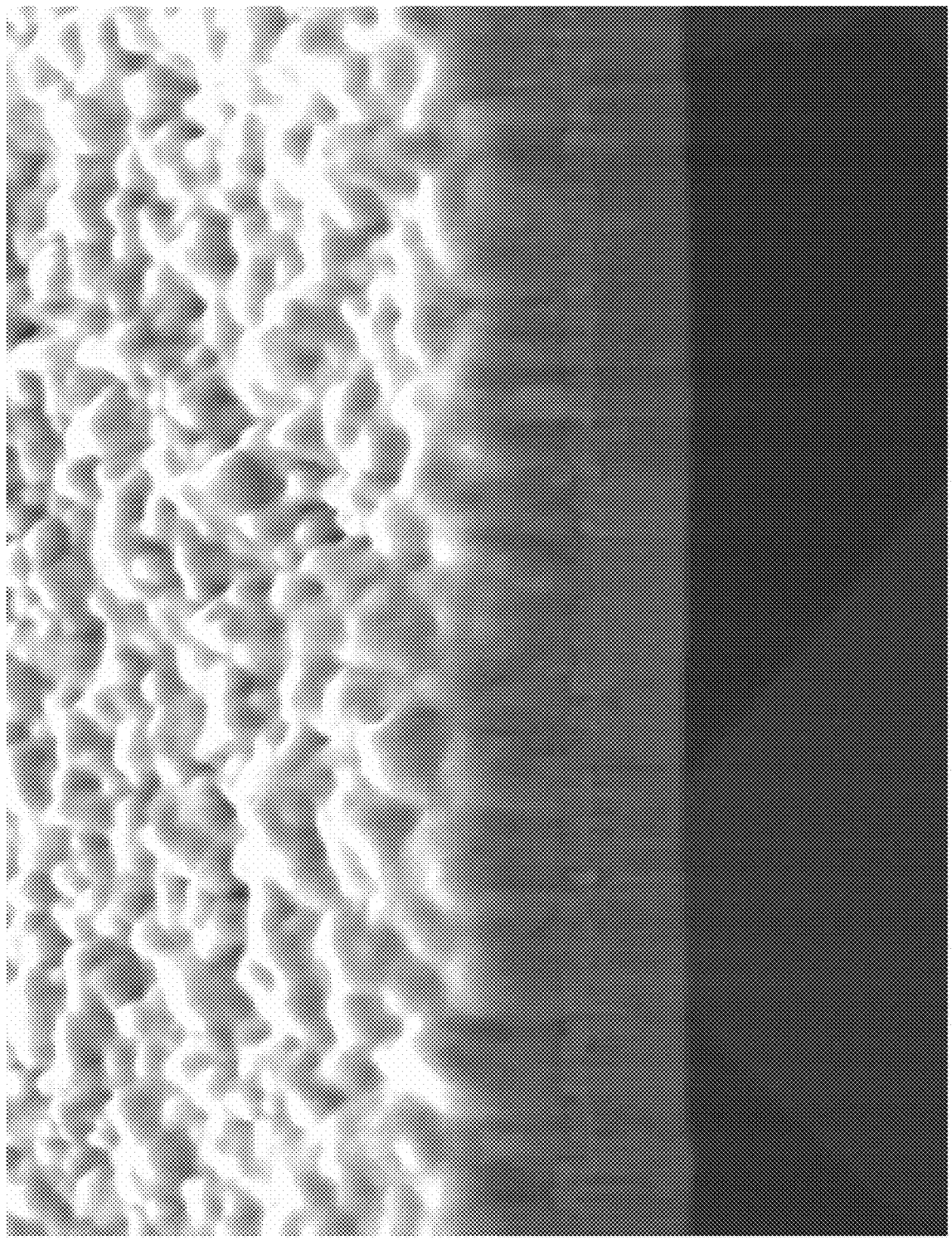
FIG. 14 shows another STEM image of an Mx-Re-My multilayer.
Figure 15:
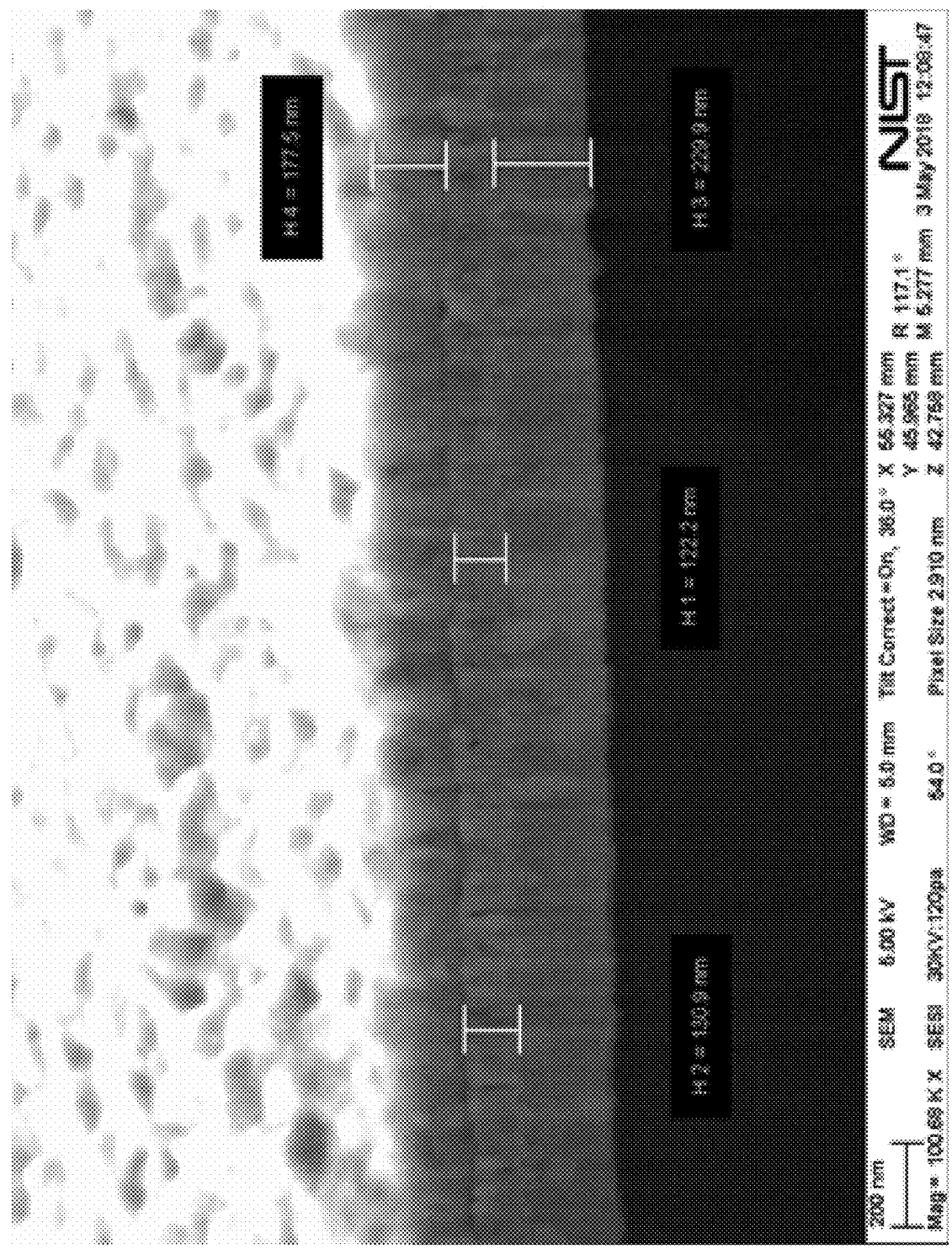
FIG. 15 shows another STEM image of an Mx-Re-My multilayer.

FIG. 7 illustrates embodiments of layer structures for the Mx-Re-My electroplated layers disclosed herein. FIG. 7A shows a cross section of a multilayer planar structure, such as would be applied to a printed circuit board. FIG. 7B shows a cross section of a multilayer planar structure such as would be applied to form a wire or cable. In both cases, the multilayer structure is formed on a substrate, such as PCB or silicon for a printed circuit board or SoC, and a dielectric core in the case of a wire or cable. At a minimum these structures can include a first conductive layer M1, an electroplated Re layer, Re1, above that, and a capping layer M2. M1 and M2 may or may not be the same material. Additional pairs of Re and capping layers Mx can be added on this base trilayer structure. Each additional Re electroplating should be followed by or capped with a final Mx or conductive layer. Although not shown, this same layering structure could be applied to the inside of a circuit board via. In that case the multilayer structure would have a donut or cylinder shape with an outermost layer being M1 and the innermost layer being M2 or Mx.

Superconducting Vias

Since they were first introduced around the time of World War II, conventional printed circuit boards ("PCBs") have simultaneously reduced in size and grown in sophistication. An important step in this evolution was the introduction of conductive vias to provide electrical communication between separate layers of a PCB. A via is an electrical connection between layers in a physical electronic circuit (such as a multilayer PCB) that goes through the plane of one or more layers. For standard, copper-based PCBs a typical non-superconducting via is formed by drilling or etching a hole in a substrate that is aligned with circuit structures on the top and bottom of the substrate, and possibly also with circuit structures within one or more inner layers of the substrate. One then coats the wall of the hole, first by a thin electroless layer, followed by a thicker electroplated layer, both using a non-superconducting metal, usually Cu. In the case of a superconducting via, one can similarly form (e.g., drilling, etching) a hole through the substrate, electroless-plate the hole with a normal non-superconducting metal using standard methods, and then electro-plate on top of the normal non-superconducting metal with a superconducting metal (e.g., instead of Cu). The result is a superconducting path from the top to the bottom of the substrate using an easily-implemented, industry standard method. However, the non-superconducting metal forms a barrier to superconducting current trying to reach interior layers of the substrate.

Previous attempts to address this problem of making superconducting connections to inner layers have been made, for instance, U.S. Pat. No. 8,441,329 entitled "Input/Output Systems and Devices for Use with Superconducting Based Computing Systems", U.S. Pat. No. 8,008,991 entitled "Systems, Methods and Apparatus for Electrical Filters", and WO2018106942 entitled "Superconducting Printed Circuit Board Related Systems, Methods, and Apparatus".

The WO2018106942 offers one solution—simply replace the non-superconducting metal with a superconducting metal. Yet, while seemingly simple in theory, in practice (from the standpoint of standard PCB fabrication procedures), actually making this replacement is complicated, many-stepped (some of which being unproven), and radically different from standard methods—in other words, undue experimentation would be required to implement the replacement that WO2018106942 theorizes. This is because the process described in that application is based on the superconducting metals aluminum (Al) or possibly niobium (Nb), neither of which can be plated from aqueous solutions, the industry standard. The application does mention the possibility of electroplating Al from ionic liquids, but then teaches away by describing how difficult this would be. The presence of water in the solution itself, in atmosphere above the solution, and in the PCB board material being plated would need to be at the parts per million level, which is difficult to achieve, and the application presents no suggestions for achieving this enabling requirement. Other methods of depositing Al, such as evaporation, sputtering, etc. are even more difficult, requiring vacuum chambers and associated equipment. These requirements would be totally outside the complexity and cost of equipment currently used to fabricate PCBs.

Because of these challenges, the vast majority of the application turns to alternative means of providing a superconducting pathway to inner layers of the PCB (e.g., FIGS. 2B-2E and FIG. 3 of the WO2018106942 application). These additional solutions are provided in recognition that FIG. 1 of WO2018106942 is non-enabling to one of skill in the art without undue experimentation. It should also be noted that WO2018106942 provides a long list of superconductors, but fails to mention Re as a replacement superconducting metal. This application also requires an annealing step, to laminate the two PCB halves, after the vias have already been formed.

The herein described embodiments overcome these challenges and provides an enabling disclosure for providing a superconducting connection (e.g., a via) to and between all interior and exterior layers of a PCB or other multilayered circuit board by way of a true superconducting via. Additionally, the via coating can occur after the PCB or multilayered circuit board has been laminated. In these embodiments, $T_c$ can be >1.8 K and for PCB materials requiring lamination temperature <150'C, it can be equal to or greater than 4.2 K. A key aspect of this solution is proximitization (or the proximity effect)—a phenomenon in which making a strong binding between a thin (e.g., less than 100 nm or less than 60 nm) non-superconductor or low-$T_c$ superconductor and a superconductor or high-$T_c$ superconductor, respectively, causes the thinner material to take on, at least partially, the qualities of the superconducting or high-$T_c$ material. See e.g., Clarke, John, *The Proximity Effect Between Superconducting and Normal Thin Films in Zero Field*, Journal de Physique, Colloque C 2, Supplement No. 2-3, Vol. 29, Fevrier-Mars 1968, pages C 2-3. It should also be noted that immiscibility between the two metals is important for the proper operation of the proximity effect. Accordingly, Re and standard microelectronics metals such as Cu, Au, Pt, Pd, Ni, Rh, Ru are strongly influence by the proximity effect when the non-superconducting layer is sufficiently thin. The thinner material is preferably between 60 nm and 100 nm in thickness, since the proximity effect tends to fall off rapidly for greater thicknesses and thus some portions of the material would maintain their bulk properties.

In this disclosure, a thin conductor (e.g., Pd, Pt, Rh of less than 100 nm or less than 60 nm) can be plated to the drilled hole (to interior conductive and insulative material) by standard electroless plating (which is commonly used in the case of copper). Given this seed conductor layer, a thicker Re layer can then be electroplated to the seed layer (since without the conductive seed layer electroplating directly to the insulative via sidewalls is not possible). The electroplated Re proximitizes the thin seed layer and can either convert a non-superconductor (e.g., Cu) into a superconductor or convert a low-$T_c$ superconductor (e.g., Rd) into a high-$T_c$ superconductor. In essence, this allows the superconducting current to superconduct through the seed layer and reach the inner layers of the multilayer circuit board, and do so without the complex laminations shown in FIGS. 2B-2E of the WO2018106942 application. Also, Re vias connecting circuits on the top and bottom of the board can be plated after all lamination (heating) steps have occurred, and thereby maintain high-$T_c$.

Figure 16:
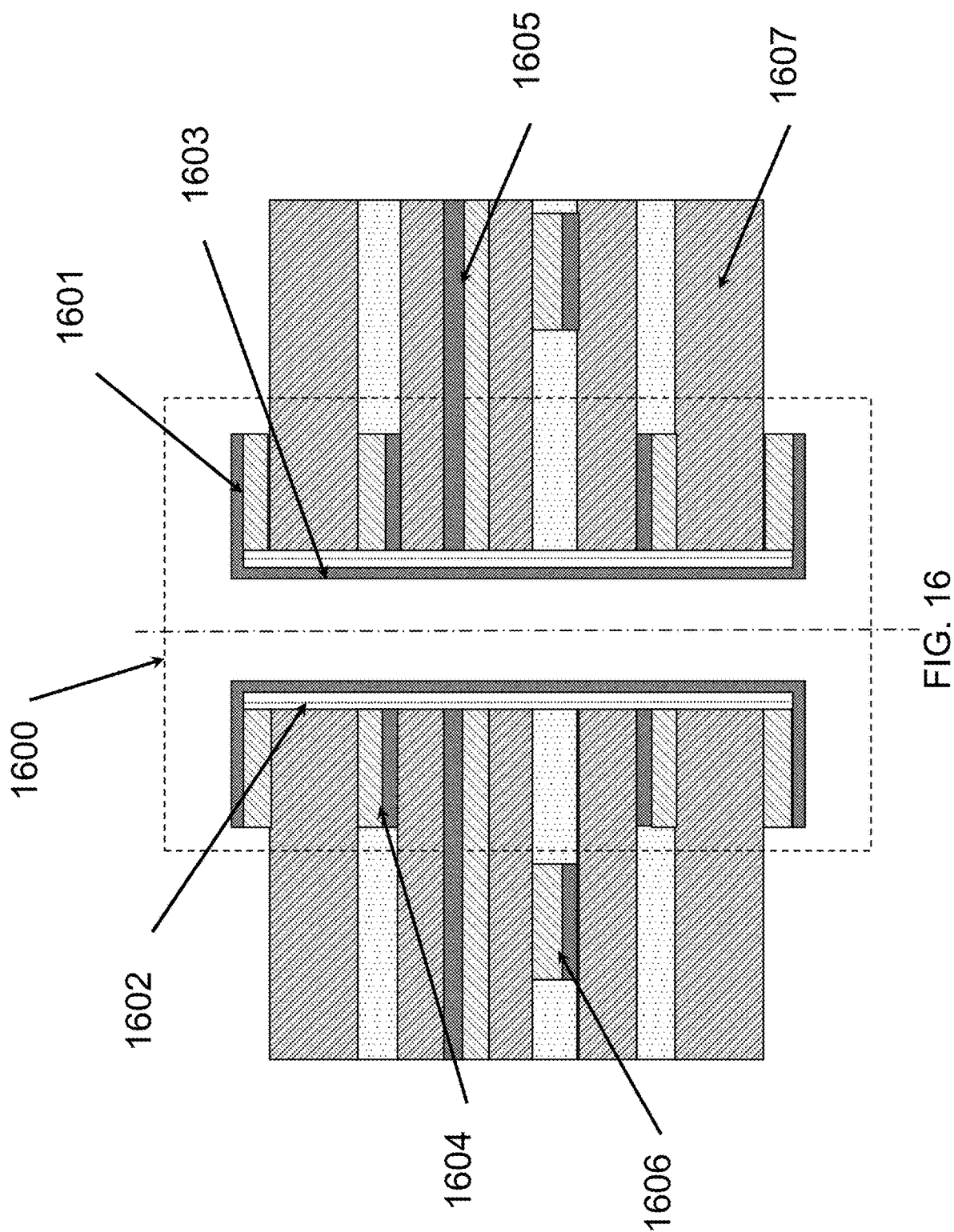
FIG. 16 illustrates an embodiment of a via structure in a multilayer PCB or other multilayer circuit board using a superconducting via that is coated after the multilayer structure has been laminated.
Figure 17:
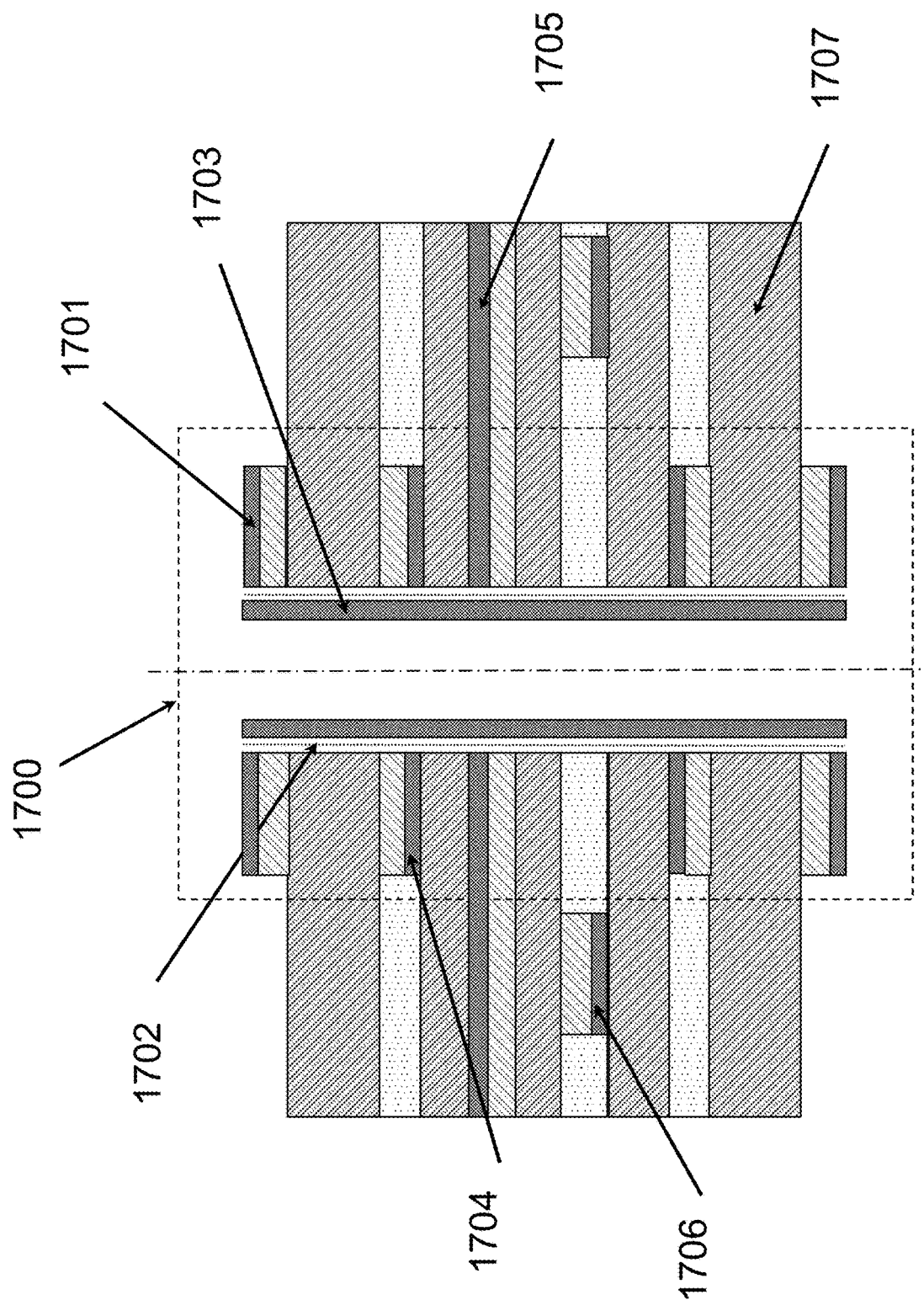
FIG. 17 illustrates another embodiment of a via structure in a multilayer PCB or other multilayer circuit board using a superconducting via that is coated after the multilayer structure has been laminated.

FIG. 16 illustrates an embodiment of a via structure in a multilayer PCB or other multilayer circuit board using a superconducting via that is coated after the multilayer structure has been laminated. The via 1600 allows a superconducting path between a top and bottom of the PCB or other circuit board and optionally between at least one (and possibly all) of the inner conducting layers that are intersected by the via.

Where a low-$T_c$ layer is proximitized, the via 1600 makes superconducting connections to "interior" traces through a low-$T_c$ superconductor 1602 that is proximitized by a high-$T_c$ superconductor 1603. Specifically, arranging a high-$T_c$ material in contact with a low $T_c$ material can cause an increase in $T_c$ in the low-$T_c$ material. Here, the high-$T_c$ via structure 1600 can include a high-$T_c$ single or multilayer superconductor 1603 electroplated onto a thin (e.g., less than 100 nm or less than 60 nm) electroless-plated, low-$T_c$ superconductor 1602. These layers can also be referred to as the inner wall 1603 and the outer wall 1602 of the via 1600. Even though the outer wall 1602 is a low-$T_c$ superconductor in isolation, it can be proximitized by the high-$T_c$ inner wall 1603 and therefore operate as a high-$T_c$ superconductor. The via 1600 can further include a high-$T_c$ electroplated single or multilayer superconductor 1601 on an exterior trace that makes direct high-$T_c$ contact to the inner wall 1602 of the via (referred to as an "exterior trace"). This layer 1601 can either be coated in the same step as the inner wall 1603 of the via as seen in FIG. 16, or these two layers can be separately coated as seen in FIG. 17. Because the inner wall 1602 has been proximitized and is now high-$T_c$, the high-$T_c$ exterior trace 1601 can be said to make a high-$T_c$ connection with the inner wall 1603 through the outer wall 1602. The via 1600 can further include a high-$T_c$ electroplated single or multi-layer superconductor 1604 on an interior trace that makes direct high-$T_c$ contact to the inner wall 1602 of the via (referred to as an "interior trace"). Because the inner wall 1602 has been proximitized and is now high-$T_c$, the high-$T_c$ interior trace 1601 can be said to make a high-$T_c$ connection with the inner wall 1603 through the outer wall 1602. Interior superconducting traces 1606 do not intersect the via 1600 and so do not make electrical connection to any other traces. The PCB or other circuit board can include a dielectric core 1607 that can be solid or flexible and with or without multiple layers.

Where a non-superconducting layer is proximitized, the via 1600 makes superconducting connections to "interior" traces through a non-superconducting layer 1602 that is proximitized by a superconductor 1603. Specifically, arranging a superconductor in contact with a non-superconducting layer can cause the non-superconducting layer to become superconducting. Here, the via structure 1600 can include a single or multilayer superconductor 1603 electroplated onto a thin (e.g., less than 100 nm or less than 60 nm) electroless-plated, non-superconducting layer 1602. These layers can also be referred to as the inner wall 1603 and the outer wall 1602 of the via 1600. Even though the outer wall 1602 is non-superconducting in isolation, it can be proximitized by the superconducting inner wall 1603 and therefore also operate as a superconductor. The via 1600 can further include a single or multilayer superconductor 1601 on an exterior trace that makes direct superconducting contact to the inner wall 1602 of the via (referred to as an "exterior trace"). This layer 1601 can either be coated in the same step as the inner wall 1603 of the via as seen in FIG. 16, or these two layers can be separately coated as seen in FIG. 17. Because the inner wall 1602 has been proximitized and is now superconducting, the superconducting exterior trace 1601 can be said to make a superconducting connection with the inner wall 1603 through the outer wall 1602. The via 1600 can further include a single or multilayer superconductor 1604 on an interior trace that makes direct superconducting contact to the inner wall 1602 of the via (referred to as an "interior trace"). Because the inner wall 1602 has been proximitized and is now superconducting, the superconducting interior trace 1601 can be said to make a superconducting connection with the inner wall 1603 through the outer wall 1602. The via 1600 can also include one or more interior superconducting traces 1606 not making contact with either inner or outer walls 1603, 1602 of the via 1600. The multilayer PCB or other circuit board can include a dielectric core 1607 that can be solid or flexible and with or without multiple layers.

In some embodiments, where high-$T_c$ operation is not needed, the outer wall 1602 can be a thin or sparse layer of a superconducting seed layer such as Pd, that is plated to the insulative via 1600 wall via electroless plating. This would enable a superconducting path to the inner layers even without proximitization. In this case, the outer wall 1602 could be thicker than the minimum thicknesses needed for the entire thickness of the outer wall 1602 to be proximitized (e.g., greater than 100 nm or greater than 60 nm).

Those of skill in the art will appreciate that FIGS. 16 and 17 are illustrative only, and that this discussion of superconducting vias is equally applicable to all types of PCBs and circuit boards regardless of the number and structure of layers (and those without any layers).

Figure 18:
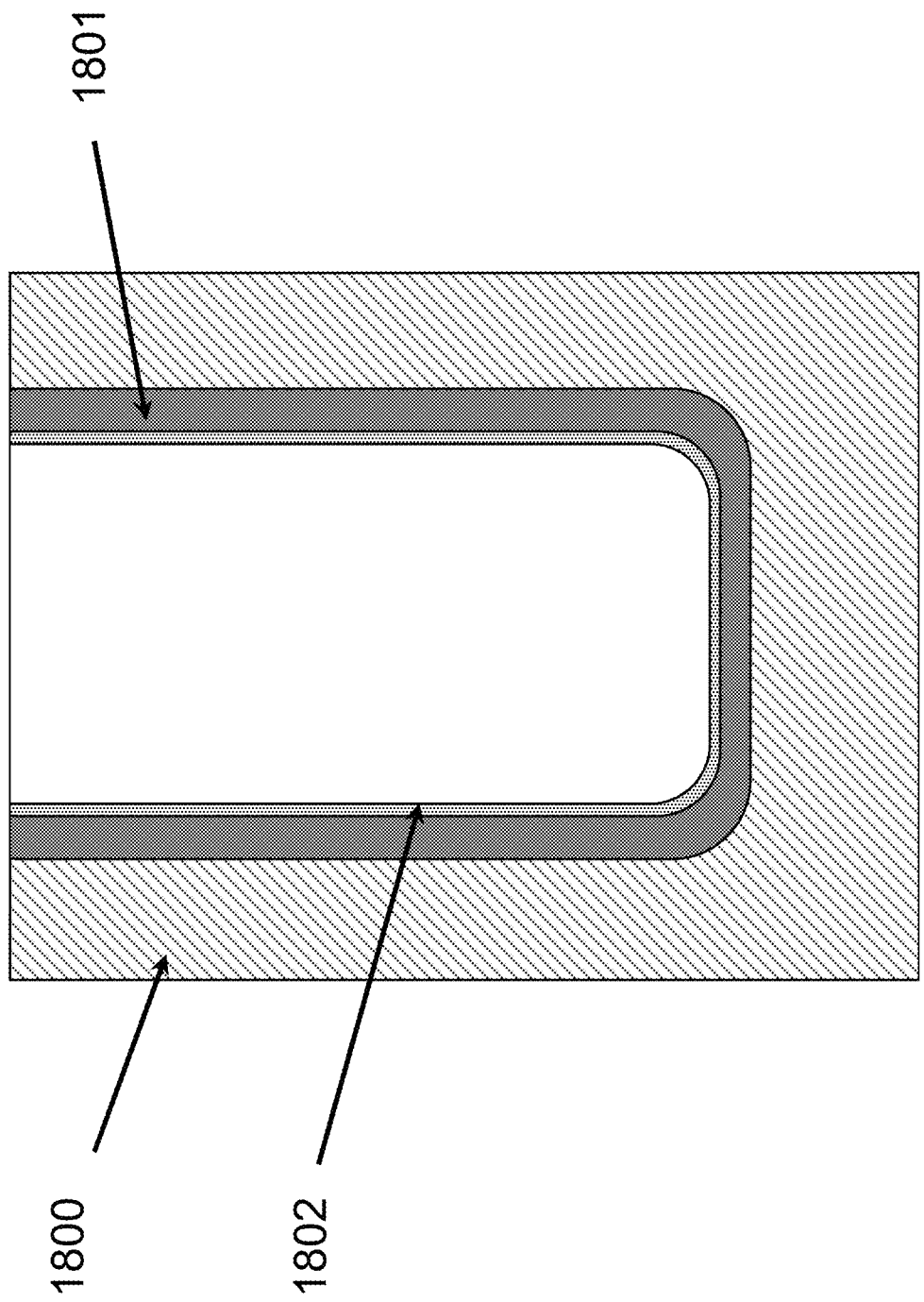
FIG. 18 illustrates an embodiment of a superconducting resonance cavity with an inner wall formed from a thin low-$T_c$ superconductor that is proximitized by a good electrical bond with a high-$T_c$ superconductor.

FIG. 18 illustrates an embodiment of a superconducting resonance cavity with an inner wall formed from a thin low-$T_c$ superconductor that is proximitized by a good electrical bond with a high-$T_c$ superconductor. This structure 1800 can have superconducting surfaces formed by plating a thin material (e.g., Pd, Rh, or Pt) 1801 directly atop a Re electroplated layer 1802 to form a low loss cavity resonator through proximitization of the thin layer 1802. The conductive block that the resonance cavity 1800 is formed from may not be superconducting (e.g., Cu). A cavity can be drilled/milled out of the block of material or can be formed via casting or other metallurgical processes. A first electroplated layer 1801 can be formed inside the cavity using a high-$T_c$ superconductor such as Re. This first layer 1801 can be formed as a single or multilayer structure. A thin second layer 1802 can then be electroplated, or plated via an electroless process, using a low-$T_c$ superconductor (e.g., Pd, Rh, or Pt). However, this second layer 1802, if appropriately thin, can be proximitized by the first layer 1802, such that both layers 1801, 1802 operate as a high-$T_c$ superconductor. Typically, the inner layer 1802 should be less than 100 nm thick, or less than 60 nm thick to optimize the proximity effect. The second layer 1802 can be referred to as a proximitized material.

FIG. 19 illustrates a superconducting circuit system. The system 1900 can be implemented as a wire (not shown) or circuit board in a vacuum chamber 1904. The chamber can be evacuated via one or more vacuum devices 1906 and cooled via one or more cooling elements 1910, 1912. A superconducting multilayer structure 1902 can be arranged within the chamber 1904. The cooling element 1912 can be directly coupled to the chamber 1904 while the optional cooling element 1910 can be directly coupled to the superconducting multilayer structure 1902. The superconducting multilayer structure 1902 can operate at or below 4.2 K or at or below 2.2 K and can pass superconducting current between a signal source 1914 and a load (not shown) or other circuitry. For instance, an optional wire bond 1905 or solder bond (not shown) can be formed at one end of the superconducting multilayer structure 1902 to couple current into a load or other circuit. An opposing end of the superconducting multilayer structure 1902 can also include a wire bond 1904 or solder bond (not shown) that provides a current path between the signal source 1914 and the superconducting multilayer structure 1902. The signal source 1914 can be arranged inside or outside of the chamber 1904.

The superconducting multilayer structure 1902 can include any of the multilayer structures described herein. For instance, it can include a substrate or core having an initial Mx-Re-My trilayer followed by an optional number of Re-My bilayers thereafter. The illustrated superconducting multilayer structure 1902 includes a first conductive layer, an electroplated Re layer, and a capping layer, though multiples of this trio can also be implemented. The Re layer can be a high-$T_c$ layer when the system 1900 is operational (e.g., cooling the chamber 1900, or at least the superconducting multilayer structure 1902, to or below 4.2 K or to or below 2.2 K). In an embodiment, the first layer in the stack can be a non-ferromagnetic conductive layer bonded to the substrate. The second layer can be a Re layer bonded to the first layer via electroplating. The Re layer can have a thickness of between 10 nm and 1000 nm (though a thicker Re layer is desirable where proximitization is intended). The third layer can be a non-ferromagnetic layer bonded to the Re layer and encapsulating the Re layer to prevent oxidization thereof. Each of these layers can be independently or simultaneously patterned to create at least a portion of a superconducting circuit. Patterning can include additive processes like deposition, where a mask dictates those portions of each layer that do not see deposition, or subtractive processes like etching, where a mask determines those portions of each layer that remain after etching.

In an embodiment, the superconducting multilayer structure 1902 can be a multilayered circuit board including one or more vias that pass from a top to a bottom of the substrate and/or to an inner or middle layer of the substrate. The vias can be coated with the same or a different set of multilayers as the top and/or bottom surfaces of the substrate. To facilitate proximitization of the first layer (bonded to the insulating/dielectric substrate), the first layer can be less than 100 nm thick or less than 60 nm thick. Where the first layer is non-superconducting in isolation and the second layer is superconducting, the first layer may become superconducting when bonded to the second superconducting layer. Where the first layer is a low-$T_c$ superconductor, and the second layer is a high-$T_c$ superconductor, the first layer may become a high-$T_c$ layer when bonded to the second high-$T_c$ layer.

Some non-limiting examples of vacuum devices include turbo (or turbomolecular) pumps, diffusion pumps, ion pumps, and linear compressors. One non-limiting examples of cooling elements include cryoheads. The combination of chamber 1904, pump 1906, and cooling element 1910, 1912 can be referred to as a low-temperature system and some non-limiting examples include a liquid helium refrigerator (or helium-3 or helium-4 refrigerator), liquid hydrogen refrigerator, dilution refrigerator, an adiabatic demagnetization refrigerator (ADR), liquid nitrogen refrigerator, regenerative-cooling refrigerator, multi-component refrigerant refrigerators, Kleemenko cycle refrigerators, pulse tube refrigerators, liquid helium cryopumps, and polycold refrigeration systems.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

CITATIONS

[1] O. A. Mukhanov, IEEE Trans. Appl. Supercond. 21, 760 (2011).
[2] Q. P. Herr, A. Y. Herr, O. T. Oberg, and A. G. Ioannidis, J. Appl. Phys. 109, Art. No. 103903 (2011).
[3] M. A. Manheimer, IEEE Trans. Appl. Supercond. 25, Art. No. 1301704 (2015).
[4] D. S. Holmes, A. L. Ripple, and M. A. Manheimer, IEEE Trans. Appl. Supercond. 23, Art. No. 1701610 (2013).
[5] M. H. Devoret and R. J. Schoelkopf, Science 339, 1169 (2013).
[6] V. Kotsubo, R. Radebaugh, P. Hendershott, M. Bonczyski, B. Wilson, S. W. Nam, and J. N. Ullom, IEEE Trans. Appl. Supercond. 27, Art. No 9500405 (2017), ISSN 1051-8223.
[7] R. Radebaugh, J. Phys.: Condens. Matter 21, Art. No. 164219 (2009).
[8] W. M. Haynes, CRC Handbook of Chemistry and Physics (92nd ed.) (CRC Press, U.S.A., 2011), ISBN 1439855110.
[9] M. P. Weides, J. S. Kline, M. R. Vissers, M. O. Sandberg, D. S. Wisbey, B. R. Johnson, T. A. Ohki, and D. P. Pappas, Appl. Phys. Lett. 99, Art. No. 262502 (2011).
[10] M. Mito, H. Matsui, K. Tsuruta, T. Yamaguchi, K. Naka-mura, H. Deguchi, N. Shirakawa, H. Adachi, T. Ya-masaki, H. Iwaoka, et al., Sci. Rep. 6, Art. No. 36337 (2016).
[11] J. G. Daunt and T. S. Smith, Phys. Rev 88, 309 (1952).
[12] C. W. Chu, W. L. McMillan, and H. L. Luo, Phys. Rev. B 3, 3757 (1971).
[12] C. W. Chu, W. L. McMillan, and H. L. Luo, Phys. Rev. B 3, 3757 (1971).
[13] L. R. Testardi, J. J. Hauser, and M. H. Read, Solid State Comm. 9, 1829 (1971).
[14] S. Sundar, S. Banik, L. S. S. Chandra, M. K. Chattopadhyay, T. Ganguli, G. S. Lodha, S. K. Pandey, D. M. Phase, and S. B. Roy, J. Phys.: Condens. Matter 28, Art. No. 315502 (2016).

[15] V. Singh, B. H. Schneider, S. J. Bosman, E. P. J. Merkx, and G. A. Steele, Appl. Phys. Lett. 105, Art. No. 222601 (2014).
[16] C. G. Fink and P. Deren, Trans. Electrochem. Soc. 66, 471 (1934).
[17] R. Levi, Rhenium plating (1952), U.S. Pat. No. 2,616,840, URL https:I/patentimages.storage.googleapis.com/8c/58/83/4352341 20f 94b3/U.S. Pat. No. 2,616,840.pdf.
[18] Y. N. Sadana and Z. Z. Wang, 37, 419 (1989).
[19] A. B. Gamburg, Yu. D. and. Drovosekovz and T. P. Puryaeva, Russian Journal of Electrochemistry 51, 376 (2015).
[20] V. V. Zhulikov and Y. D. Gamburg, Russian Journal of Electrochemistry 52, 847 (2016).
[21] S.-Y. Chang, L.-P. Liang, L.-C. Kao, and C.-F. Lin, Jour-nal of The Electrochemical Society 162, D96 (2015).
[22] J. Mazierska, M. V. Jacob, D. Ledenyov, and J. Krupk, in 2005 Asia-Pacific Microwave Conference Proceedings (2005), vol. 4, p. 2370.
[23] B. Knook, W. Star, H. V. Rongen, and G. V. den Berg, Physica 30, 1124 (1964), ISSN 0031-8914, URL http://www.sciencedirect.com/science/art icle/pii/003189146490103X.
[24] H. Okamoto and T. B. Massalski, Bulletin of Alloy Phase Diagrams 5, 383 (1984), ISSN 0197-0216, URL https://doi.org/10.1007/BF02872959.
[25] F. A. Shunk, Constitution of Binary Alloys, Second Sup-plement (McGraw-Hill Book Company, U.S.A., 1985), ISBN 0-931690-20-X.
[26] B. Predel, Au—Re (Gold-Rhenium) (Springer Berlin Hei-delberg, Berlin, Heidelberg, 1991), pp. 1-1, ISBN 978-3-540-39444-0, URL https://doi.org/10.1007/10000866_311.
[27] C. Kittel, Introduction to Solid State Physics, 5th edition (John Wiley & Sons, Inc., U.S.A., 1976), ISBN 0-471-49024-5.
[28] M. Tinkham, Introduction to Superconductivity, Second Edition (Dover Publications, Mineola, N.Y., 1996), ISBN 978-0-486-43503-9, 0-486-43503-2.
[29] S. Probst, F. B. Song, P. A. Bushev, A. V. Ustinov, and M. Weides, Rev. of Sci. Instr. 86, 024706 (2015), ISSN 0197-0216.
[30] D. P. Pappas, M. R. Vissers, D. S. Wisbey, J. S. Kline, and J. Gao, IEEE Trans. Appl. Supercond. 21, 871 (2011).
[31] H. M. Syed, C. Webb, and E. M. Gray, Progress in Solid State Chemistry 44, 20 (2016).
[32] B. Knook, W. M. Star, H. J. M. Van Rongen, G. J. Van Den Berg, Physica 30, 1124-1130, Communication No. 339a from the Kamerlingh Onnes Laboratorium, (1964).

What is claimed:

1. A superconducting circuit system comprising:
a means for maintaining the circuit at or below 6.0 K;
a substrate having a circular cross section;
a first conductive layer bonded to the substrate;
an amorphous Re layer deposited over the first conductive layer using electroplating, and the amorphous Re layer having a thickness of between 10 nm and 1000 nm; and
a second conductive layer bonded to the amorphous Re layer.

2. The superconducting circuit system of claim 1, wherein the first and second conductive layers are immiscible with the amorphous Re layer.

3. The superconducting circuit system of claim 1, wherein the second conductive layer encapsulates the amorphous Re layer.

4. The superconducting circuit system of claim 1, wherein the means for maintaining the circuit at or below 6.0 K is a means for maintaining the circuit at or below 5.0 K.

5. The superconducting circuit system of claim 1, further comprising one or more additional pairs of layers between the first conductive layer and the amorphous Re layer and wherein each of the one or more additional pairs of layers comprise another amorphous Re layer and another conductive layer.

6. The superconducting circuit system of claim 1, wherein either or both of the first and second conductive layers are independently chosen from the group comprising Cu, Au, Pt, Pd, Ni, Rh, Ru, and Sn.

7. The superconducting circuit system of claim 1, wherein the first conductive layer is less than 100 nm in thickness, and wherein the first conductive layer in isolation is non-superconducting or a low-$T_c$ superconductor, but when bonded to the amorphous Re layer becomes a high-$T_c$ superconductor via proximitization.

8. A superconducting circuit system comprising:
a means for maintaining the circuit at or below 6.0 K;
a substrate;
a first conductive layer bonded to the substrate;
an amorphous Re layer deposited over the first conductive layer using electroplating, and the amorphous Re layer having a thickness of between 10 nm and 1000 nm;
a second conductive layer bonded to the amorphous Re layer; and
one or more additional pairs of layers between the first conductive layer and the amorphous Re layer and wherein each of the one or more additional pairs of layers comprise another amorphous Re layer and another conductive layer.

9. The superconducting circuit system of claim 8, wherein the first and second conductive layers are immiscible with the amorphous Re layer.

10. The superconducting circuit system of claim 8, wherein the second conductive layer encapsulates the amorphous Re layer.

11. The superconducting circuit system of claim 1, wherein the means for maintaining the circuit at or below 6.0 K is a means for maintaining the circuit at or below 5.0 K.

12. The superconducting circuit system of claim 8, wherein the substrate has a circular cross section.

13. The superconducting circuit system of claim 8, wherein either or both of the first and second conductive layers are independently chosen from the group comprising Cu, Au, Pt, Pd, Ni, Rh, Ru, and Sn.

14. The superconducting circuit system of claim 8, wherein the first conductive layer is less than 100 nm in thickness, and wherein the first conductive layer in isolation is non-superconducting or a low-$T_c$ superconductor, but when bonded to the amorphous Re layer becomes a high-$T_c$ superconductor via proximitization.

15. A method of fabricating at least one superconducting circuit on a multilayer circuit board, the method comprising:
forming a via between at least two layers of the multilayer circuit board;
applying a first conductive layer onto a wall of the via by electroless plating;
electroplating an amorphous Re layer above the first conductive layer to a thickness of between 10 nm to 1000 nm;
applying a second conductive layer onto the amorphous Re layer; wherein
the superconducting circuit is superconducting at or above 4.2K.

16. The method of claim 15, wherein the first conductive layer is immiscible with the amorphous Re layer.

17. The method of claim 15, wherein the second conductive layer encapsulates the amorphous Re layer.

18. The method of claim 15, further comprising making a wire bond or solder connection between the second conductive layer and another circuit or between the first conductive layer and an internal conductive trace of the multilayer circuit board.

19. The method of claim 15, further comprising, after applying the second conductive layer onto the amorphous Re layer, annealing the superconducting circuit at 100-150° C. for up to 10 minutes.

20. The method of claim 15, further comprising making the first conductive layer a high-$T_c$ superconductor via proximity effect and bonding with the amorphous Re layer.

* * * * *